United States Patent
Takayama et al.

(10) Patent No.: US 6,909,341 B2
(45) Date of Patent: Jun. 21, 2005

(54) SURFACE ACOUSTIC WAVE FILTER UTILIZING A LAYER FOR PREVENTING GRAIN BOUNDARY DIFFUSION

(75) Inventors: Ryoichi Takayama, Osaka (JP); Hidekazu Nakanishi, Osaka (JP); Tetsuo Kawasaki, Osaka (JP); Toru Sakuragawa, Osaka (JP); Yasuhiko Yokota, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 60 days.

(21) Appl. No.: 10/168,284

(22) PCT Filed: Oct. 23, 2001

(86) PCT No.: PCT/JP01/09303
§ 371 (c)(1),
(2), (4) Date: Oct. 8, 2002

(87) PCT Pub. No.: WO02/35702
PCT Pub. Date: May 2, 2002

(65) Prior Publication Data
US 2003/0174028 A1 Sep. 18, 2003

(30) Foreign Application Priority Data
Oct. 23, 2000 (JP) .................................. 2000-322321
Oct. 23, 2000 (JP) .................................. 2000-322322

(51) Int. Cl.[7] .............................................. H03H 9/64
(52) U.S. Cl. .................... 333/193; 333/195; 29/25.35; 310/313 B
(58) Field of Search ............................... 333/193–196, 333/133; 29/25, 35; 310/313 B, 364

(56) References Cited
U.S. PATENT DOCUMENTS 4,775,814 A * 10/1988 Yuhara et al. ............ 310/313 R
5,162,690 A * 11/1992 Ieki et al. ................ 310/313 R
5,773,917 A *  6/1998 Satoh et al. ................ 310/364
5,844,347 A * 12/1998 Takayama et al. ...... 310/313 R
5,909,156 A *  6/1999 Nishihara et al. ........... 333/193
6,259,185 B1 *  7/2001 Lai ........................ 310/313 B
6,297,580 B1 * 10/2001 Takayama et al. .......... 310/364
6,316,860 B1 * 11/2001 Kimura et al. .......... 310/313 A (Continued)

FOREIGN PATENT DOCUMENTS

| JP | 03-014308 | | 1/1991 |
| JP | 07-122961 | | 5/1995 |
| JP | 8-97671 | * | 4/1996 |
| JP | 9-172351 | * | 6/1997 |
| JP | 10-256862 | | 9/1998 |
| WO | WO 99/05788 | | 2/1999 |

OTHER PUBLICATIONS

Japanese search report for PCT/JP01/09303 dated Jan. 29, 2002.
English translation of Form PCT/ISA/210, mailed Nov. 4, 1998.

*Primary Examiner*—Barbara Summons
(74) *Attorney, Agent, or Firm*—Ratner Prestia

(57) ABSTRACT

In a surface acoustic wave (SAW) filter including a substrate and an electrode formed on the substrate, the electrode includes a base layer, a first metal layer made of a metal consisting of Al or consisting mainly of Al, and having a given orientation relative to the substrate, a second layer for preventing the first metal layer from migration of Al atoms occurring in vertical to the substrate, and a third layer for adjusting a thickness of the layer. In this SAW filter having an arbitrary layer thickness, the layer hardly causes grain boundary diffusion, and grains of the layer can be made fine for effective resistance to stress. Thus, in this SAW filter, the migration of the Al atoms of the electrode that is associated with the SAW propagation-induced stress imposed on the electrode is inhibited. Accordingly, the filter exhibits excellent resistance against electric power.

61 Claims, 14 Drawing Sheets

U.S. PATENT DOCUMENTS 6,377,138 B1 * 4/2002 Takagi et al. ................ 333/193
6,486,591 B2 * 11/2002 Nishihara ................... 310/364
6,630,767 B2 * 10/2003 Inoue et al. ............. 310/313 A
6,657,366 B2 * 12/2003 Watanabe et al. ........... 310/364

* cited by examiner

SURFACE ACOUSTIC WAVE FILTER UTILIZING A LAYER FOR PREVENTING GRAIN BOUNDARY DIFFUSION

This Application is a U.S. National Phase Application of PCT International Application PCT/JP01/09303.

TECHNICAL FIELD

The present invention relates to a surface acoustic wave filter including an electrode, such as a comb electrode, formed on a substrate, and a method of manufacturing the filter.

BACKGROUND ART

A conventional surface acoustic wave device disclosed in Japanese Patent Laid-Open No.3-14308 includes a piezoelectric substrate and an electrode provided on the substrate. The electrode is constructed of an epitaxially-grown aluminum film having a certain crystal orientation. The film contains a little additive, such as Cu, Ti, Ni, Mg or Pd, which has excellent migration resistance, thus preventing migration.

The electrode is formed of the single-layer epitaxially grown aluminum film and has grain size grown as large as a thickness of the film. Consequently, if having a thickness equal to or more than a certain thickness, the electrode weakens against a stress accompanied with propagation of surface acoustic waves, thus exhibiting a degraded resistance to an electric power. Particularly being constructed of a single-crystal film having no grain boundary, the electrode has a sub-grain boundary formed when the stress is applied for a long time. Consequently, the stress concentrates on the portion, thus weakening the electrode against the stress accompanied with the propagation of the surface acoustic waves.

DISCLOSURE OF THE INVENTION

A surface acoustic wave (SAW) filter with improved resistance to stress accompanied with propagation of surface acoustic waves is provided.

The SAW filter includes a substrate and an electrode provided on the substrate. The electrode includes a metal layer having a thickness of 200 nm or less and a given orientation relative to the substrate.

A method of manufacturing the SAW filter includes forming of the electrode including the metal layer including Al, and forming of at least a portion of an Al-diffusion-preventing layer on a side of the electrode by sputter etching simultaneously with the forming of the electrode.

DESCRIPTION OF THE PREFERRED EMBODIMENTS (Exemplary Embodiment 1)

Figure 1:
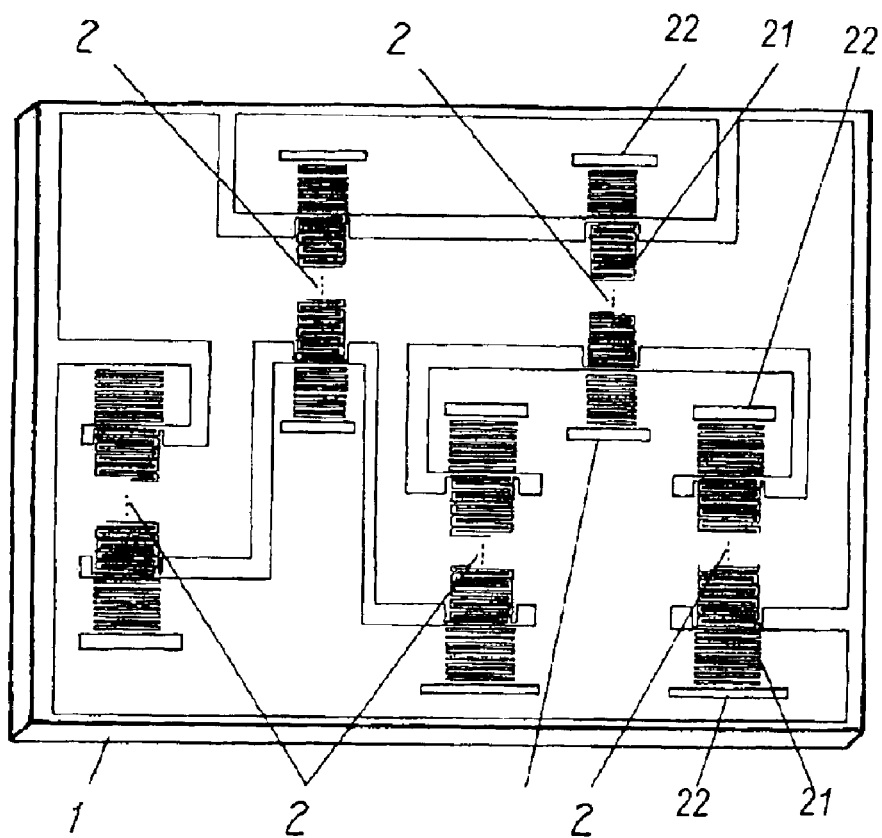
FIG. 1 is a perspective view of a surface acoustic wave (SAW) filter in accordance with exemplary embodiments of the present invention.
Figure 2:
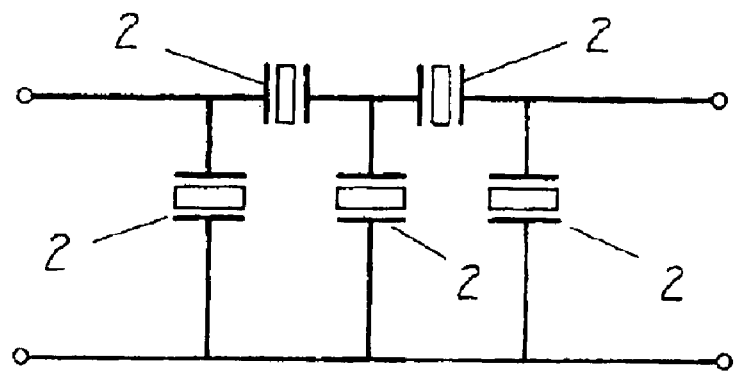
FIG. 2 is a block diagram of the SAW filter in accordance with the embodiments.

FIG. 1 is a perspective view of a surface acoustic wave (SAW) filter in accordance with exemplary embodiments of the present invention, and FIG. 2 is a block diagram of the filter. The SAW filter is a ladder-type surface acoustic wave filter including substrate 1 and five surface acoustic wave resonators each including electrode 2 formed on a top surface of substrate 1. The resonators are coupled in a ladder configuration. Electrode 2 includes comb electrode 21 and reflector 22. In the embodiments of the invention, substrate 1 is a 36°-rotated Y-cut lithium tantalate substrate. In exemplary embodiment 1, a band pass filter including the comb electrode having fingers disposed by a pitch of about 0.6×2 μm and has a center frequency of 1.8 GHz.

FIGS. 3 to 6 are sections of the electrodes, essential parts of respective SAW filters of examples 1 to 4 in accordance with embodiment 1. FIGS. 7 to 10 are sections of electrodes of respective SAW filters of comparative examples 1 to 4.

Figure 3:
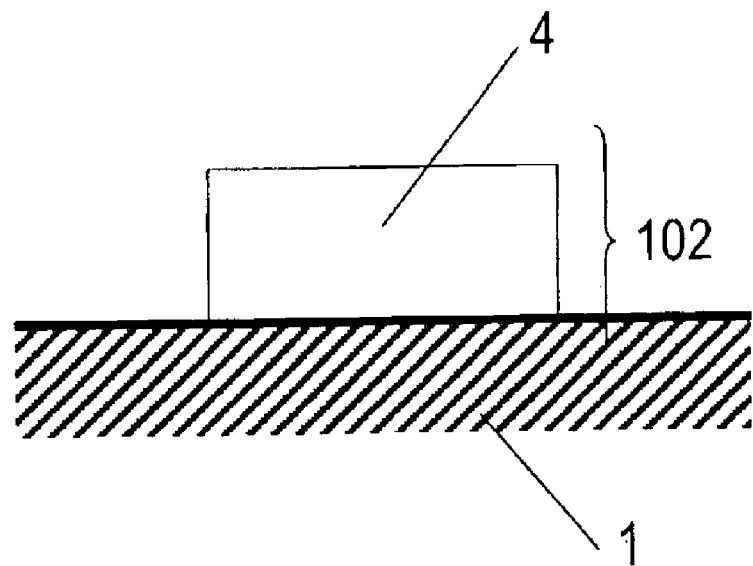
FIG. 3 is a section of a comb electrode, an essential part of a SAW filter of example 1 in accordance with exemplary embodiment 1 of the present invention.

Electrode 102 of example 1, as shown in FIG. 3, includes first layer 4 having a thickness of 20 nm formed on substrate 1.

Figure 4:
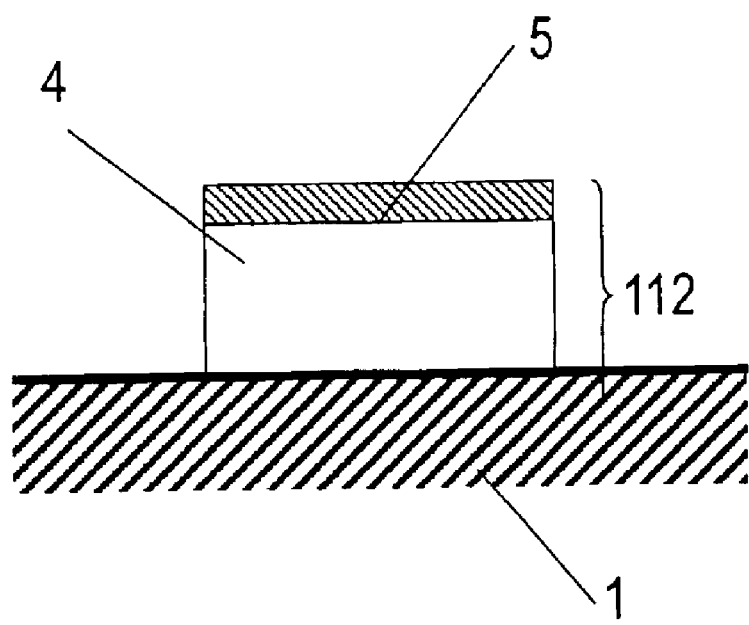
FIG. 4 is a section of a comb electrode, an essential part of a SAW filter of example 2 in accordance with embodiment 1.

Electrode 112 of example 2, as shown in FIG. 4, includes first layer 4 having a thickness of 200 nm and second layer 5 that are stacked over substrate 1. Second layer 5 prevents the first layer from grain boundary diffusion of Al atoms occurring in vertical to the substrate.

Figure 5:
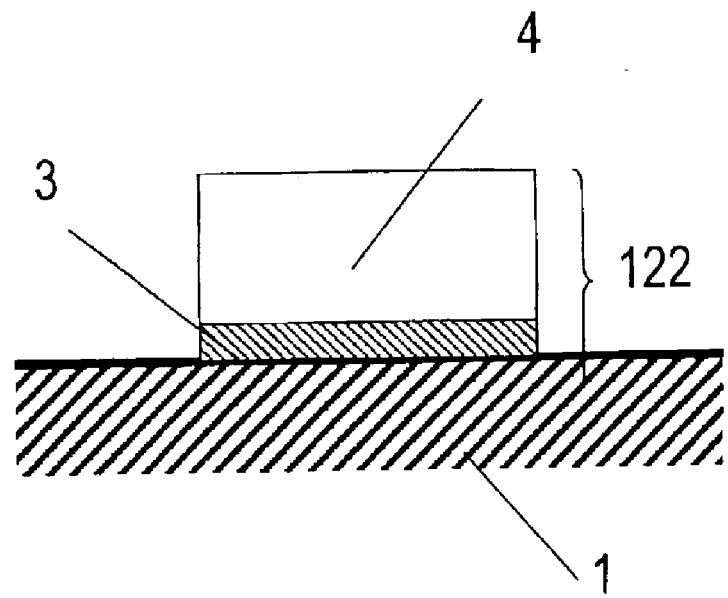
FIG. 5 is a section of a comb electrode, an essential part of a SAW filter of example 3 in accordance with embodiment 1.

Electrode 122 of example 3, as shown in FIG. 5, includes base layer 3 and first layer 4 having a thickness of 200 nm that are stacked over substrate 1 in this order.

Figure 6:
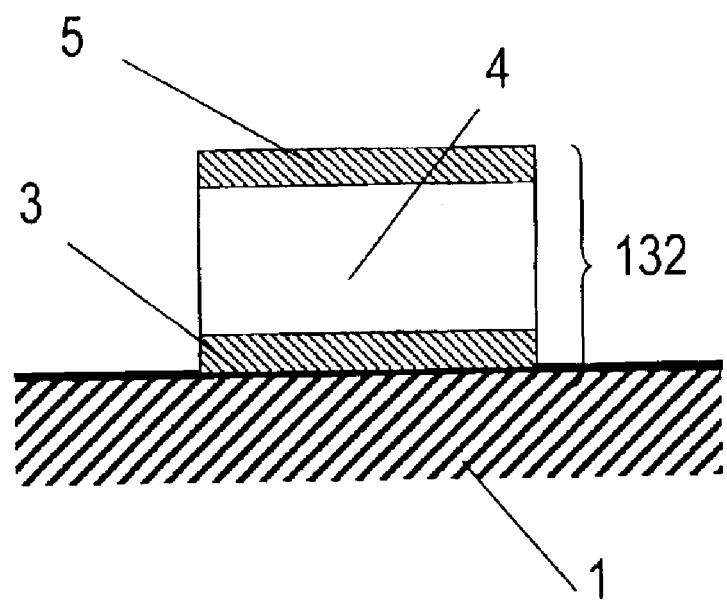
FIG. 6 is a section of a comb electrode, an essential part of a SAW filter of example 4 in accordance with embodiment 1.

Electrode 132 of Example 4, as shown in FIG. 6, includes base layer 3, first metal layer 4 having a thickness of 200 nm, and layer 5 that are stacked over substrate 1 in this order. Layer 5 prevents the first metal layer from grain boundary diffusion.

Figure 7:
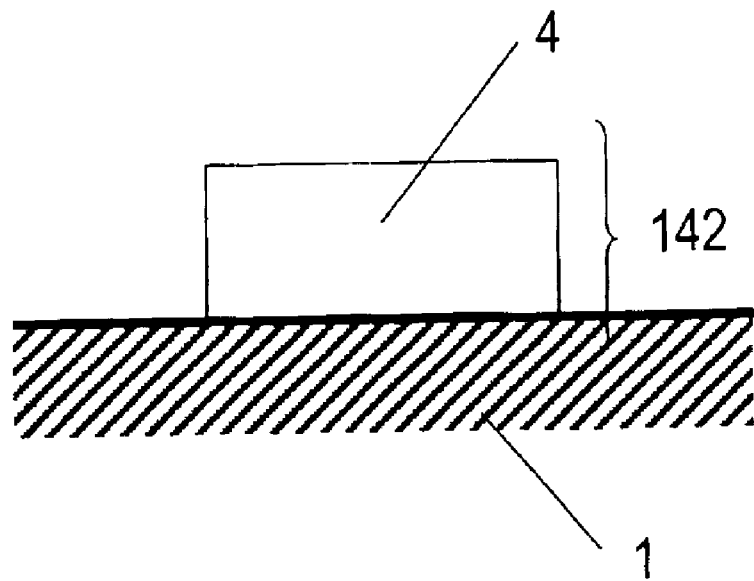
FIG. 7 is a section of a comb electrode, an essential part of a SAW filter of comparative example 1 in accordance with embodiment 1.

Electrode 142 of comparative example 1 is, as shown in FIG. 7, metal layer 4 having a thickness of 200 nm formed on substrate 1.

Figure 8:
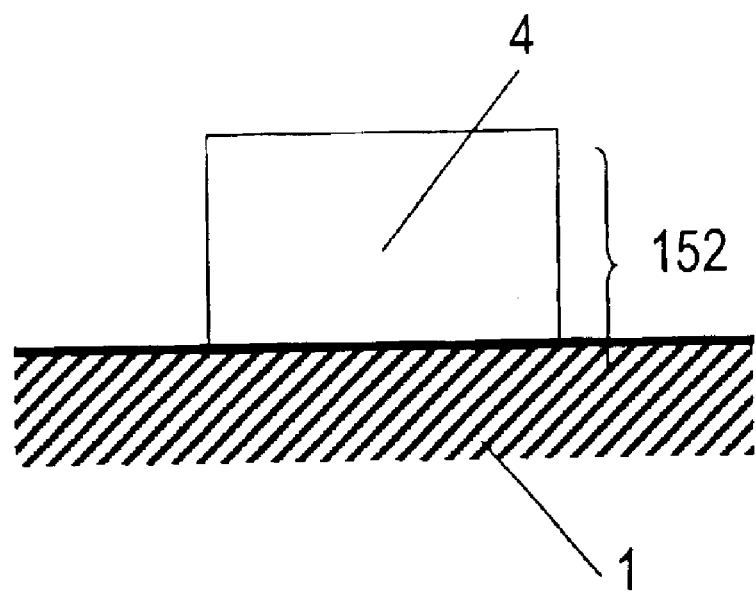
FIG. 8 is a section of a comb electrode, an essential part of a SAW filter of comparative example 2 in accordance with embodiment 1.

Electrode 152 of comparative example 2 is, as shown in FIG. 8, metal layer 4 having a thickness of 250 nm formed on substrate 1.

Figure 9:
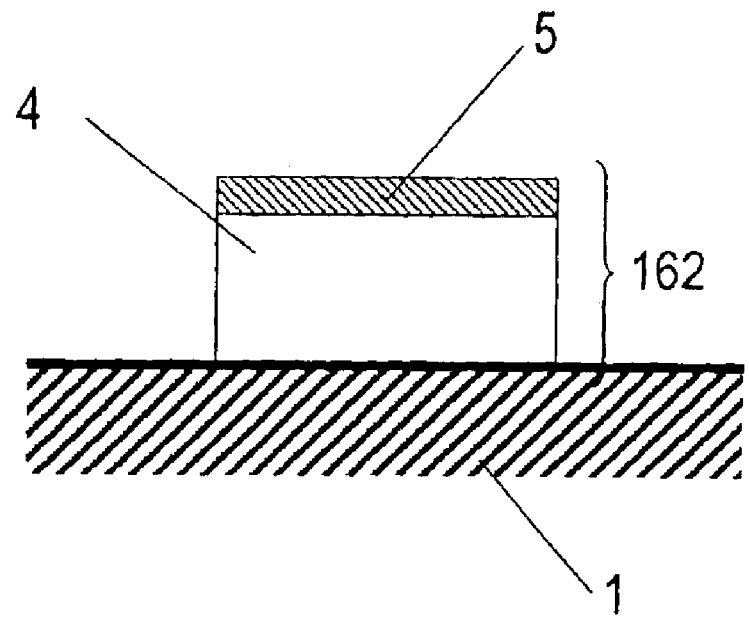
FIG. 9 is a section of a comb electrode, an essential part of a SAW filter of comparative example 3 in accordance with embodiment 1.

Electrode 162 of comparative example 3, as shown in FIG. 9, includes first metal layer 4 having a thickness of 200 nm and second metal layer 5 that are stacked over substrate 1 in this order. Second metal layer 5 prevents the first metal layer from grain boundary diffusion of Al atoms occurring in vertical to the substrate.

Figure 10:
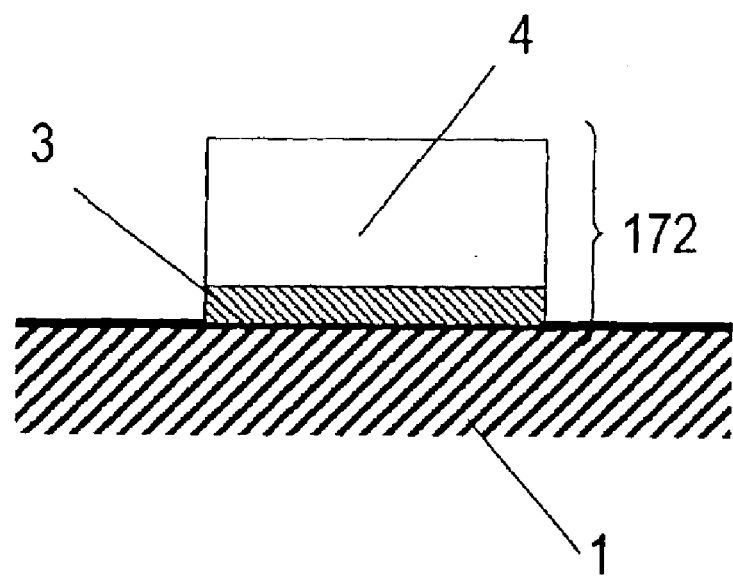
FIG. 10 is a section of a comb electrode, an essential part of a SAW filter of comparative example 4 in accordance with embodiment 1.

Electrode 172 of comparative example 4, as shown in FIG. 10, includes first metal layer 3, i.e., a base layer, and second metal layer 4 having a thickness of 200 nm that are stacked over substrate 1 in this order.

Table 1 shows materials for the layers, thicknesses, and methods of forming the layers of the electrodes of examples 1 to 4 and comparative examples 1 to 4.

TABLE 1

| | Number of Layers | | Base Layer | First Layer | Second Layer | Method of Forming Layers | Section of Electrode |
|---|---|---|---|---|---|---|---|
| Example 1 | 1 | Material | — | *AlZrCu | — | IBS | FIG. 3 |
| | | Thickness | — | 200 | — | | |
| Example 2 | 2 | Material | — | *AlZrCu | Ti | IBS | FIG. 4 |
| | | Thickness | — | 200 | 20 | | |
| Example 3 | 2 | Material | Ti | *AlZrCu | — | DCMS | FIG. 5 |
| | | Thickness | 20 | 200 | — | | |
| Example 4 | 3 | Material | Ti | *AlZrCu | Ti | DCMS | FIG. 6 |
| | | Thickness | 10 | 200 | 10 | | |
| Comparative Example 1 | 1 | Material | — | AlZrCu | — | DCMS | FIG. 7 |
| | | Thickness | — | 200 | — | | |
| Comparative Example 2 | 1 | Material | — | *AlZrCu | — | IBS | FIG. 8 |
| | | Thickness | — | 250 | — | | |
| Comparative Example 3 | 2 | Material | — | AlZrCu | Ti | DCMS | FIG. 9 |
| | | Thickness | — | 200 | 20 | | |
| Comparative Example 4 | 2 | Material | Cr | AlZrCu | — | DCMS | FIG. 10 |
| | | Thickness | 20 | 200 | — | | |

IBS: Ion beam sputtering
DCMS: DC magnetron sputtering
The asterisk "*" in the "material" column denotes a (111)-oriented layer.
All the thicknesses are in nm.

As shown in Table 1, the metal consisting of Al or consisting mainly of Al is an AlZrCu alloy in embodiment 1. The electrodes each including the base layer and/or the second layer employs Ti except for comparative example 4, which employs Cr for the base layer. The layers are formed by either ion beam sputtering or DC magnetron sputtering. Having the electrode layers formed, the electrodes were examined by a θ–2θ X-ray diffraction method to determine orientation. Regarding the orientation of examples 1 and 2 and comparative example 2 which use the ion beam sputtering to form the electrode layers as well as examples 3 and 4 which use Ti for base layer 3, only a (111) peak of Al for the AlZrCu layers was observed. It was observed that the Al alloy layer was an oriented layer having a (111)-orientation in vertical to the substrate. Regarding the other electrode layers, no peak was observed from a specified crystal plane, and it was confirmed that they were not oriented layers but non-oriented polycrystalline layers. In the present embodiment, the Al electrode used for the filter was designed to have a layer thickness of 200 nm. Differences in characteristics that depend on thicknesses and materials of the electrodes were adjusted by changing the pitch of the fingers of the comb electrodes, thus providing the filters with a center frequency of about 1.8 GHz. The electrodes were patterned by photolithography and dry etching and thereafter diced into chips. Each one of the chips was die-bonded to a ceramic package and electrically connected by wire bonding. Thereafter, a cover is welded to it in a nitrogen atmosphere for hermetic sealing it to provide the SAW filter having the electrodes.

A signal of a highest frequency in a passing band, which is the weakest point of the ladder type filter, is applied to the filters made in accordance with the present embodiment for a test for a resistance against an electric power. The test is suspended periodically for measuring characteristics of the SAW filter. The filter is verified as degraded at a point where an insertion loss in the passing band increases by 0.5 dB or more, and a total test time between the starting of the test and the degradation is determined as a life time. In an accelerated degradation test, an electric power and a temperature were factors responsible for accelerated degradation. The accelerated degradation test was conducted on the filter and includes two kinds of tests. One for determination of the life time under several applied electric powers with the chip surface maintained in a temperature, and the other for determination of the life time under several temperatures of the chip with a constant applied electric power. The Eyring model and the results of these two tests are used to estimate the life time when the applied electric power and the environmental temperature are 1W and 50° C., respectively. A life time of 50,000 hours was qualified as a criteria for evaluation of the resistance to the electric power. Table 2 shows the estimated life time of the SAW filters having the electrodes shown in Table 1. Table 2 also shows crystal grain sizes of the AlZrCu layers of the electrodes.

TABLE 2

|  | Crystal Grain Size (nm) | Estimated Life Time (hrs) |  | Crystal Grain Size (nm) | Estimated Life Time (hrs) |
| --- | --- | --- | --- | --- | --- |
| Example 1 | 200 | 55,000 | Comparative Example 1 | 200 | 1,500 |
| Example 2 | 200 | 70,000 | Comparative Example 2 | 250 | 12,000 |
| Example 3 | 200 | 56,000 | Comparative Example 3 | 200 | 5 |
| Example 4 | 200 | 74,000 | Comparative Example 4 | 200 | 1,500 |

Table 2 shows that the SAW filters including the electrodes of examples 1 to 4 have the estimated life time exceeding 50,000 hours, while the filters of comparative examples 1 to 4 have the estimated life time less than 50,000 hours. The AlZrCu layer of each of the electrodes has the crystal grain size substantially identical to a thickness of the layer. Although the filter of comparative example 2 has the life time less than 50,000 hours, unlike the other comparative examples, the filter has considerably improved resistance to an electric power. The electrode of example 1 defers from the electrode of comparative example 2 in a thickness of the layer and the crystal grain size. A conductive layer has a crystal grain size increasing in proportion to a thickness of the layer. The SAW device including a single-layer electrode of the oriented layer as the electrode layer has a thickness of the electrode of 200 nm or less and a life time exceeding 50,000 hours. With consideration given to variations in resistance to electric power, the layer preferably has a thickness less than 100 nm. According to the above discussion, the layer consisting of Al or consisting mainly of Al is preferably is an oriented layer having a small crystal grain size to form an electrode having high resistance to the electric power. Limiting the layer thickness is effective for reducing the crystal grain size.

(Exemplary Embodiment 2)

FIGS. 11 to 14 are sections of electrodes, essential parts of surface acoustic wave (SAW) filters of examples 5 to 8 in accordance with exemplary embodiment 2 of the present invention. FIG. 15 is a section of an electrode of a SAW filter of comparative example 5.

Figure 11:
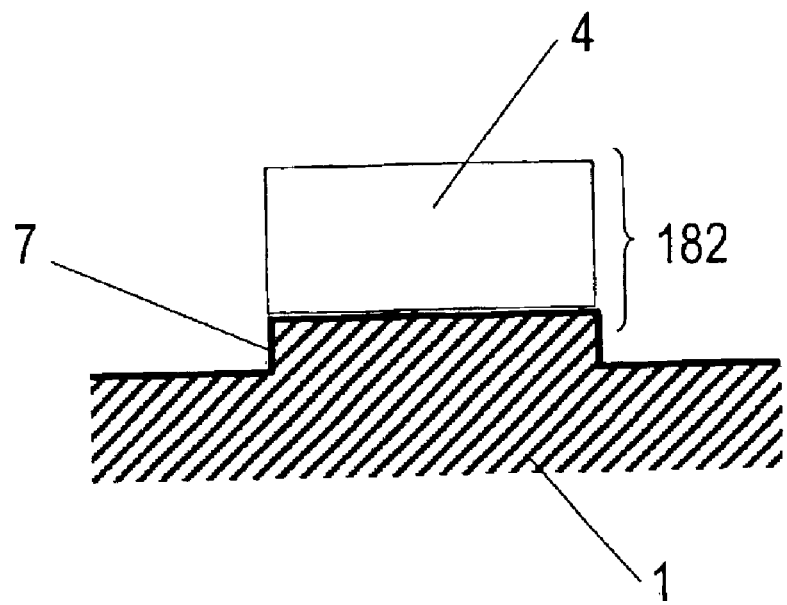
FIG. 11 is a section of a comb electrode, an essential part of a SAW filter of example 5 in accordance with exemplary embodiment 2 of the invention.

Electrode 182 of example 5 is, as shown in FIG. 11, first layer 4 having a thickness of 200 nm formed on a top of bump 7 of substrate 1.

Figure 12:
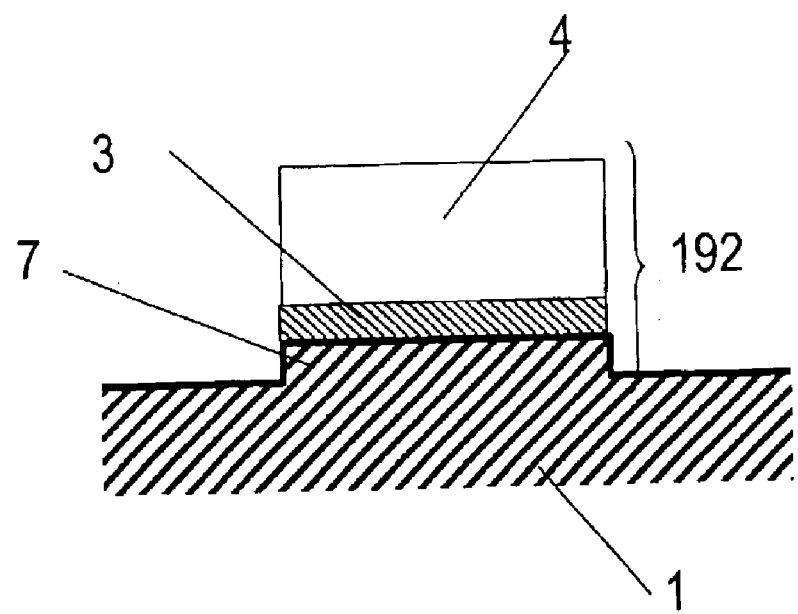
FIG. 12 is a section of a comb electrode, an essential part of a SAW filter of example 6 in accordance with embodiment 2.

Electrode 192 of example 6, as shown in FIG. 12, includes base layer 3 formed on a top of bump 7 of substrate 1 and first layer 4 having a thickness of 200 nm which are stacked in this order over substrate 1.

Figure 13:
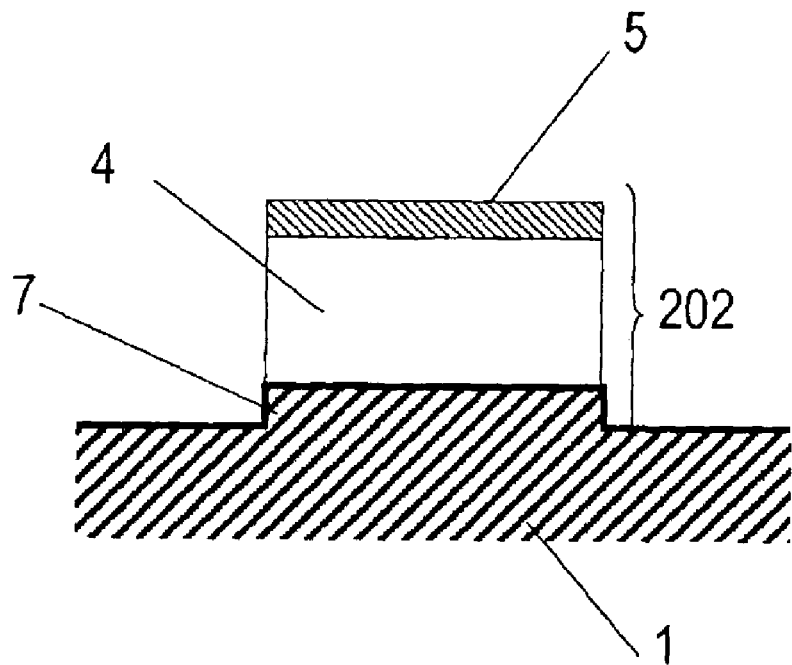
FIG. 13 is a section of a comb electrode, an essential part of a SAW filter of example 7 in accordance with embodiment 2.

Electrode 202 of example 7, as shown in FIG. 13, includes first metal layer 4 having a thickness of 200 nm formed on a top of bump 7 of substrate 1 and second layer 5 which are stacked in this order over substrate 1. Second layer 5 prevents the first metal layer from grain boundary diffusion.

Figure 14:
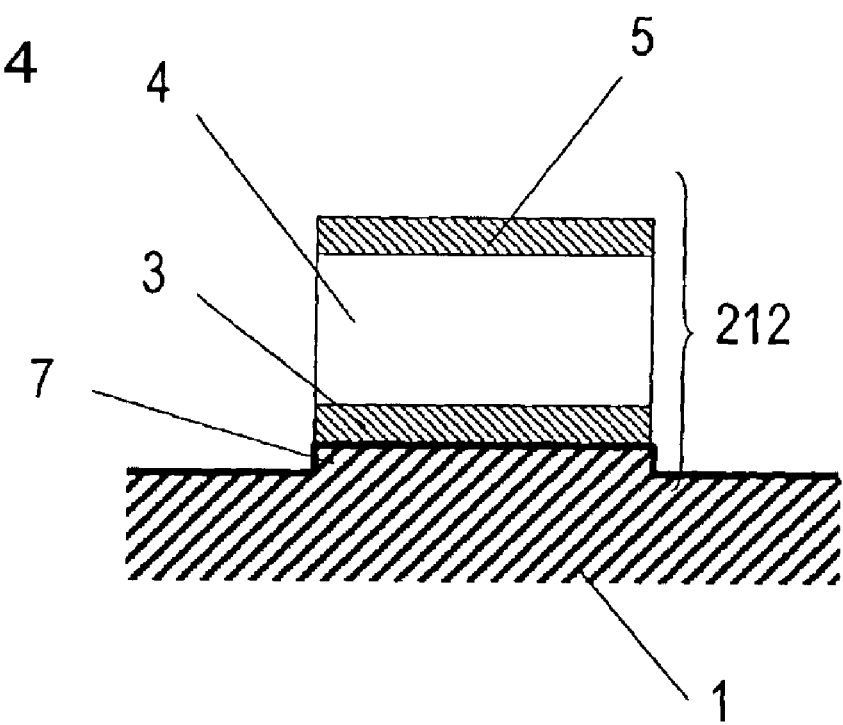
FIG. 14 is a section of a comb electrode, an essential part of a SAW filter of example 8 in accordance with embodiment 2.
Figure 15:
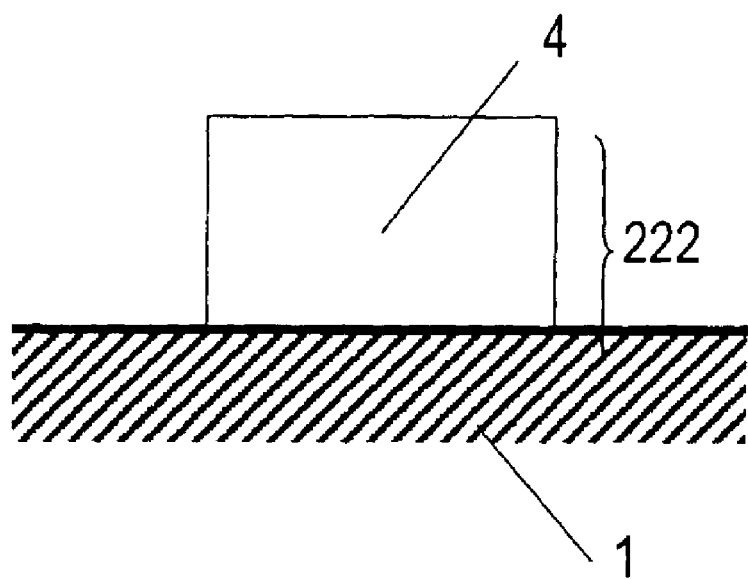
FIG. 15 is a section of a comb electrode, an essential part of a SAW filter of comparative example 5 in accordance with embodiment 2.

Electrode 212 of example 8, as shown in FIG. 14, includes base layer 3 formed on a top of bump 7 of a substrate, first metal layer 4 having a thickness of 200 nm, and second layer 5 which are stacked in this order over substrate 1. Second layer 5 prevents the first metal layer from grain boundary diffusion.

Electrode 222 of comparative example 5 is, as shown in FIG. 15, metal layer 4 having a thickness of 300 nm formed on substrate 1.

Table 3 shows materials for the layers, thicknesses of the layers, and methods of forming the layers of the electrodes of examples 5 to 9 and comparative example 5.

TABLE 3

|  | Number of Layers | Step of Substrate (nm) |  | Base Layer | First Layer | Second Layer | Method of Forming Layers | Section of Electrode |
| --- | --- | --- | --- | --- | --- | --- | --- | --- |
| Example 5 | 1 | 20 | Material | — | *AlMgCu | — | IBS | FIG. 11 |
|  |  |  | Thickness | — | 200 | — |  |  |
| Example 6 | 2 | 15 | Material | Ti | *AlMgCu | — | DCMS | FIG. 12 |
|  |  |  | Thickness | 20 | 200 | — |  |  |
| Example 7 | 2 | 15 | Material | — | *AlMgCu | Ti | IBS | FIG. 13 |
|  |  |  | Thickness | — | 200 | 20 |  |  |
| Example 8 | 3 | 10 | Material | Ti | *AlMgCu | Ti | DCMS | FIG. 14 |
|  |  |  | Thickness | 20 | 200 | 20 |  |  |
| Comparative Example 5 | 1 | — | Material | — | *AlMgCu | — | IBS | FIG. 15 |
|  |  |  | Thickness | — | 300 | — |  |  |

IBS: Ion beam sputtering
DCMS: DC magnetron sputtering
The asterisk "*" in the "material" column denotes a (111)-oriented layer.
All the thicknesses are in nm.

As shown in Table 3, the metal layer consisting of Al or consisting mainly of Al in embodiment 2 employs an AlMgCu alloy. The electrodes each having the base layer and/or the second layer use Ti. The layers of the electrodes are formed by either ion beam sputtering or DC magnetron sputtering. Having the electrode layers formed, the electrodes were examined by a θ–2θ X-ray diffraction method to determine orientation. Regarding the orientation of the AlMgCu layers of examples 5 to 8 and comparative example 5, only a (111) peak of Al was observed. It was observed that the Al alloy layer was an oriented layer having a (111) orientation in vertical to the substrate. The filters of embodiment 2 have structures identical to those of embodiment 1. The tested filter was designed to include the Al electrode having a thickness of 300 nm and to have a center frequency of about 1.75 GHz. Differences in characteristics that depend on thicknesses and materials of the electrodes are adjusted by changing height of the bump of each one of the substrates to provide the filter with the center frequency of about 1.75 GHz.

Thus, the comb electrodes of examples 5 to 8 and comparative example 5 have fingers substantially at the same pitch. The electrodes are patterned by photolithography and reactive ion etching. Mixed gas including BCl3 and Cl2 is used as etching gas. Consequently, in the reactive ion etching, chemical etching with a Cl* radical and a BCl3* radical and sputter etching with a BCl3+ ion are carried out simultaneously for the patterning. The bump of the substrate of each one of examples 5 to 8 is formed by controlling etching time. Subsequently to the patterning, the substrate is diced into chips. Each one of the chips is die-bonded to a ceramic package and electrically connected by wire bonding. Thereafter, a cover is welded in a nitrogen atmosphere for hermetic sealing, thus providing the SAW filter having the electrode.

The filters made in accordance with embodiment 2 are evaluated in the same manner as that of embodiment 1 in resistance to an electric power. Table 4 shows an estimated life time of the SAW filters having the electrodes shown in Table 3. Table 4 also shows crystal grain sizes of AlMgCu layers 4 of the electrodes.

TABLE 4

| | Crystal Grain Size (nm) | Estimated Life Time (hrs) | | Crystal Grain Size (nm) | Estimated Life Time (hrs) |
|---|---|---|---|---|---|
| Example 5 | 200 | 55,000 | Comparative Example 5 | 300 | 9,500 |
| Example 6 | 200 | 56,000 | | | |
| Example 7 | 200 | 70,000 | | | |
| Example 8 | 200 | 74,000 | | | |

As shown in Table 4, each of the SAW filters including the electrodes of examples 5 to 8 has the estimated life time exceeding 50,000 hours, a criteria, while the filter of comparative example 5 has the estimated life time less than 50,000 hours. The AlMgCu layer of each electrode has the crystal grain size substantially the same as a thickness of the layer. As mentioned above, the Al electrode of the filter is designed to include the layer having a thickness of 300 nm in embodiment 2. The substrate is provided with the bump as a part of the electrode, and the metal layer consisting of Al or consisting mainly of Al has a thickness of 200 nm or less. Consequently, the electrode exhibits the same resistance against an electric power as the electrodes of examples 1 to 4 described in embodiment 1 and has the life time of 50,000 hours (the criteria of resistance against an electric power) or more. As a result, regarding the SAW filter including an electrode including a layer having a thickness of 200 nm or more for exhibiting desired characteristics, the substrate preferably includes a bump as a part of the electrode, and the electrode consisting of Al or consisting mainly of Al preferably is an oriented layer having a thickness of 200 nm or less and has a reduced crystal grain size for having an improved resistance against the electric power.

(Exemplary Embodiment 3)

FIGS. 16 to 19 are sections of electrodes which are essential parts of respective SAW filters of examples 9 to 12 in accordance with exemplary embodiment 3 of the present invention. FIG. 20 is a section of an electrode of a SAW filter of comparative example 6.

Figure 16:
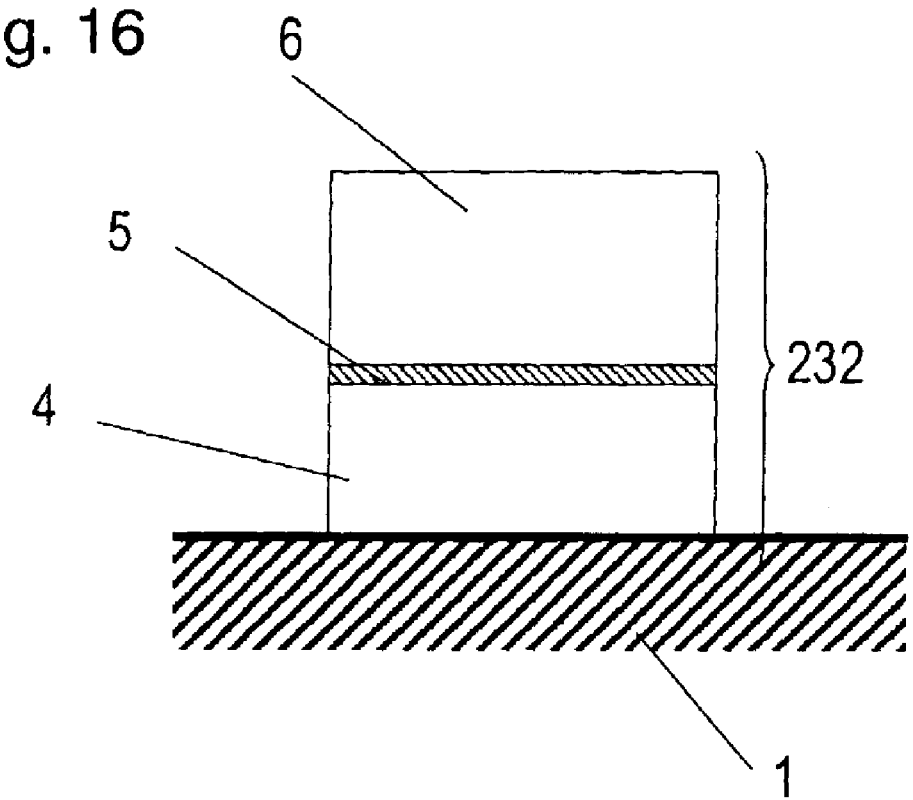
FIG. 16 is a section of a comb electrode, an essential part of a SAW filter of example 9 in accordance with exemplary embodiment 3 of the invention.

Electrode 232 of example 9, as shown in FIG. 16, includes first metal layer 4 having a thickness of 200 nm, second layer 5, and third layer 6 which are stacked in this order over substrate 1. Second layer 5 prevents first metal layer 4 from grain boundary diffusion of Al atoms occurring in vertical to the substrate, while third layer 6 is provided for adjusting a thickness of electrode 232.

Figure 17:
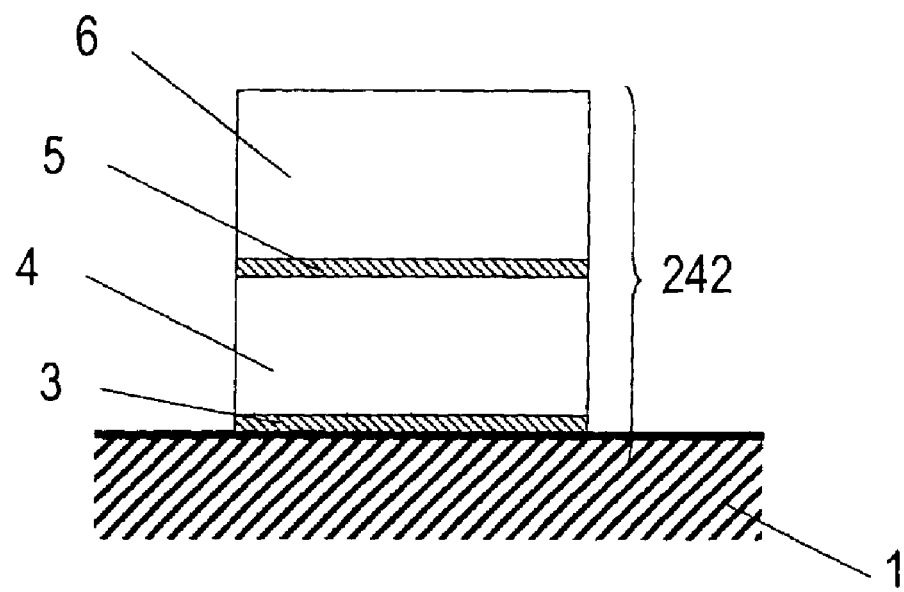
FIG. 17 is a section of a comb electrode, an essential part of a SAW filter of example 10 in accordance with embodiment 3.

Electrode 242 of Example 10, as shown in FIG. 17, includes base layer 3, first metal layer 4 having a thickness of 200 nm, second layer 5, and third layer 6 which are stacked in this order over substrate 1. Second layer 5 prevents first metal layer 4 from grain boundary diffusion of Al atoms occurring in vertical to the substrate, while third layer 6 is provided for adjusting a thickness of electrode 242.

Figure 18:
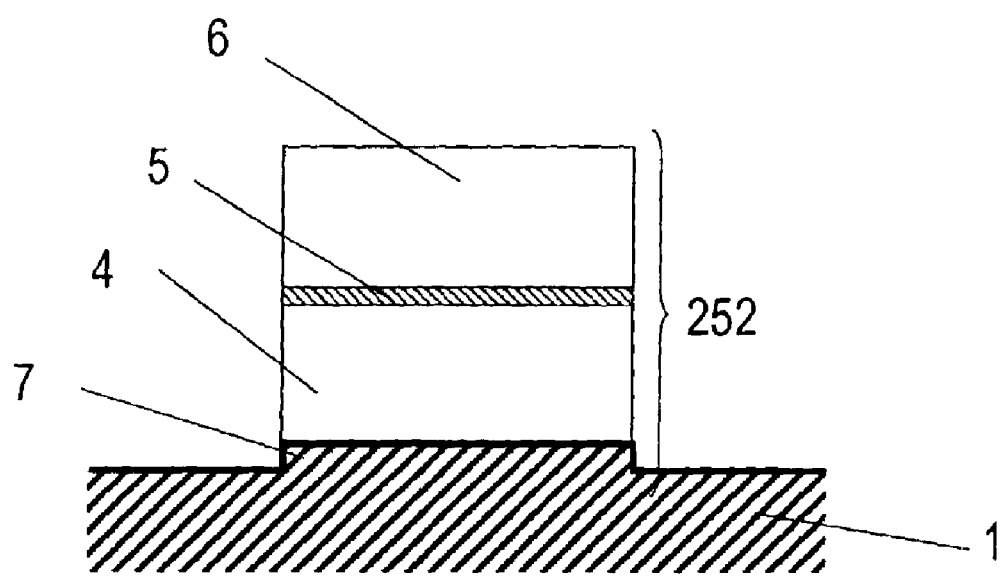
FIG. 18 is a section of a comb electrode, an essential part of a SAW filter of example 11 in accordance with embodiment 3.

Electrode 252 of Example 11, as shown in FIG. 18, includes first metal layer 4 having a thickness of 200 nm formed on a top of bump 7 of substrate 1, second layer 5 for preventing first metal layer 4 from grain boundary diffusion of Al atoms occurring in vertical to the substrate, and third layer 6 for adjusting a thickness of electrode 252.

Figure 19:
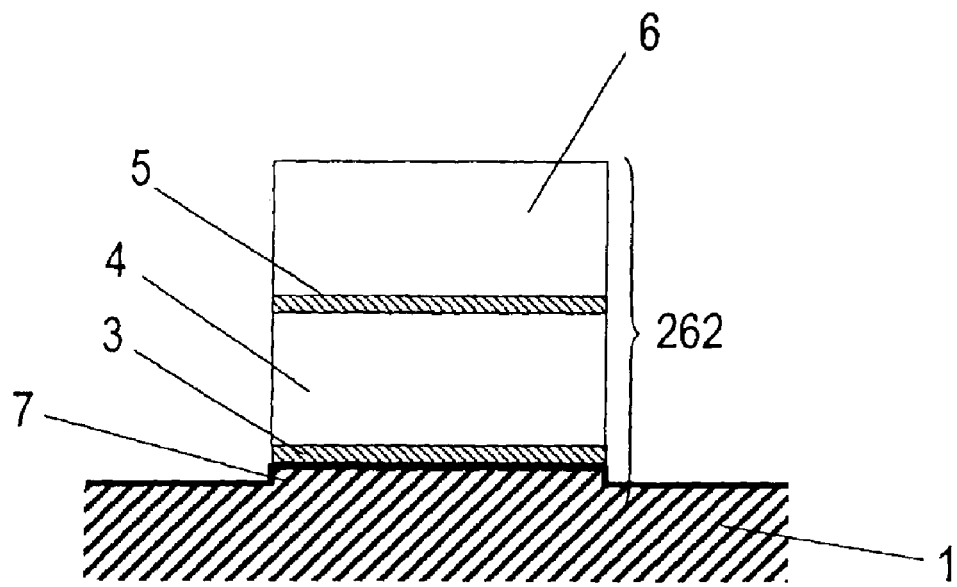
FIG. 19 is a section of a comb electrode, an essential part of a SAW filter of example 12 in accordance with embodiment 3.
Figure 20:
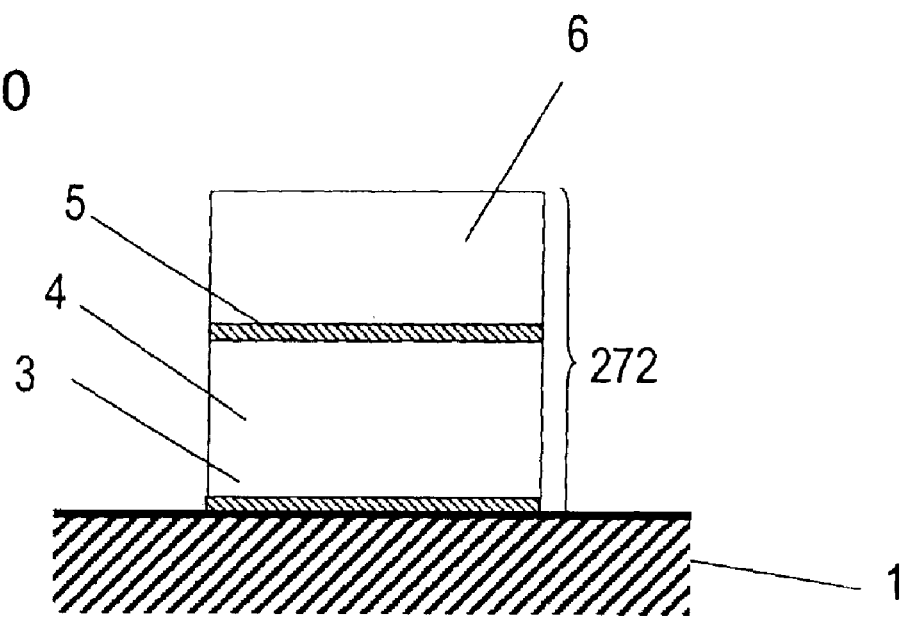
FIG. 20 is a section of a comb electrode, an essential part of a SAW filter of comparative example 6 in accordance with embodiment 3.

Electrode 262 of Example 12, as shown in FIG. 19, includes base layer 3 formed on a top of bump 7 of substrate 1, first metal layer 4 having a thickness of 200 nm, second layer 5, and third layer 6 which are stacked in this order over substrate 1. Second layer 5 prevents first metal layer 4 from grain boundary diffusion, while third layer 6 is provided for adjusting a thickness of electrode 262.

Electrode 272 of comparative example 6, as shown in FIG. 20, includes base layer 3, first metal layer 4 having a thickness of 280 nm, second layer 5, and third layer 6 which are stacked in this order over substrate 1. Second layer 5 prevents first metal layer 4 from gram boundary diffusion of Al atoms occurring in vertical to the substrate, while third layer 6 is provided for adjusting a thickness of electrode 272.

Table 5 shows materials of the respective layers, thicknesses of the layers and methods of forming the layers of the electrodes of examples 5 to 9 and comparative example 5.

TABLE 5

| | | Number of Layers | Bump of Substrate (nm) | | Base Layer | First Layer | Second Layer | Third Layer | Method of Forming Layers | Section of Electrode |
|---|---|---|---|---|---|---|---|---|---|---|
| Example 9 | | 3 | — | Material | — | *AlMg | Ti | AlMg | IBS | FIG. 16 |
| | | | | Thickness | — | 200 | 10 | 260 | | |
| Example 10 | | 4 | — | Material | Ti | *AlMg | Ti | AlMg | DCMS | FIG. 17 |
| | | | | Thickness | 10 | 200 | 10 | 250 | | |
| Example 11 | | 3 | 10 | Material | — | *AlMg | Ti | AlMg | IBS | FIG. 18 |
| | | | | Thickness | — | 200 | 10 | 200 | | |
| Example 12 | | 4 | 7 | Material | Ti | *AlMg | Ti | AlMg | DCMS | FIG. 19 |
| | | | | Thickness | 10 | 200 | 10 | 200 | | |
| Comparative Example 6 | | 4 | — | Material | Ti | *AlMg | Ti | AlMg | DCMS | FIG. 20 |
| | | | | Thickness | 10 | 280 | 10 | 200 | | |

IBS: Ion beam sputtering
DCMS: DC magnetron sputtering
DCMS: DC magnetron sputtering
The asterisk "*" in the "material" column denotes a (111)-oriented layer.
All the thicknesses are in nm.

As shown in Table 5, the metal consisting of Al or consisting mainly of Al in the present embodiment employs an AlMg alloy, and the base layer and the second layer employ Ti. The layers are formed by either ion beam sputtering or DC magnetron sputtering. Having the electrode layers formed, the electrodes was examined by a θ-2θ X-ray diffraction method to determine orientation. Regarding the orientation of the AlMg layers of examples 9 to 12 and comparative example 6, only a (111) peak of Al is observed, and it is verified that the Al alloy layer is an oriented layer having a (111) orientation in vertical to the substrate. Since each electrode includes two AlMg layers, that is, the first layer and the third layer, another sample including a base layer and a first layer is made under the same conditions for forming the layers for determining the orientation. The filters of embodiment 3 have structures identical to those of embodiment 1. However, the filter including the Al electrode designed to have a thickness of 480 nm to have a center frequency of about 800 MHz. Differences in characteristics that depend on thicknesses and materials of the electrodes are adjusted by changing height of the bump of each substrate and changing the thickness of the third layer to provide the center frequency of about 800 MHz. Thus, the comb electrodes of examples 9 to 12 and comparative example 6 have fingers at substantially the same pitch. The electrodes and the filters are made in the same manner as those of embodiment 2.

The filters made in accordance with embodiment 3 are evaluated in the same manner as that in embodiment 1 in respective resistances against an electric power. Table 6 shows estimated life time of the respective SAW filters having the respective electrodes shown in Table 5. Table 6 also shows crystal grain sizes of the respective AlMg layers (the first layers) of the electrodes.

TABLE 6

| | Crystal Grain Size (nm) | Estimated Life Time (hrs) | | Crystal Grain Size (nm) | Estimated Life Time (hrs) |
|---|---|---|---|---|---|
| Example 9 | 200 | 53,000 | Comparative Example 6 | 280 | 8,800 |
| Example 10 | 200 | 55,000 | | | |
| Example 11 | 200 | 57,000 | | | |
| Example 12 | 200 | 58,000 | | | |

The crystal grain size represents the crystal grain size of the first layer.

As shown in Table 6, each SAW filter including the electrode of examples 9 to 12 has the estimated life time exceeding 50,000 hours, while the filter of comparative example 6 has the estimated life time less than 50,000 hours. The AlMg layer (the first layer) of each electrode has a crystal grain size which is substantially the same as a thickness of the layer. The first metal layer consisting of Al or consisting mainly of Al has a thickness of 200 nm or less, while the Al electrode of the filter, as described above, is designed to have a thickness of 480 nm in embodiment 2. The thickness of the first metal layer is set to 200 nm or less by providing the second layer for limiting the thickness of the first layer, and the third layer for adjusting the thickness of the electrode over the first layer, and/or by providing the bump as a part of the electrode to the substrate. Accordingly, the filter has high resistance against an electric power and has the life time of 50,000 hours (a criteria of evaluation for resistance against an electric power) or more. After the test, the filters of examples 9 and 10 has a hillock caused by the diffusion observed at the surface of the comb electrode besides a degraded portion of the electrode. The diffusion of the Al atoms is caused by degradation of the third layer adjusting the thickness. The filters of examples 11 and 12 have no hillock. Thus, the third layer consisting of Al or consisting mainly of Al preferably has a thickness of 200 nm or less. Further, a fourth layer may be provided on the third layer to restrain the diffusion of the Al atoms from the third layer. Although each filter of examples 11 and 12 and comparative example 6 have no hillock caused by the diffusion of the Al atoms at the surfaces of their respective electrodes after the test, the filter has a side hillock on opposed faces of the comb electrode. The above results show that, in order for the SAW filter requiring the thickness of 200 nm or more of the electrode layer for desired characteristics to have the resistance against an electric power, the second layer and the third layer are preferably provided over the first layer consisting of Al or consisting mainly of Al and having the thickness of 200 nm or less. The second layer is provided for limiting the thickness of the first layer, and the third layer is provided for adjusting the thickness of the electrode layer over the first layer. Moreover, the crystal grain size can be smaller by the bump as the part of the electrode provided to the substrate to prevent the third layer from getting thicker, and by the layer consisting of Al or consisting mainly of Al having the thickness of 200 nm or less.

(Exemplary Embodiment 4)

Figure 21:
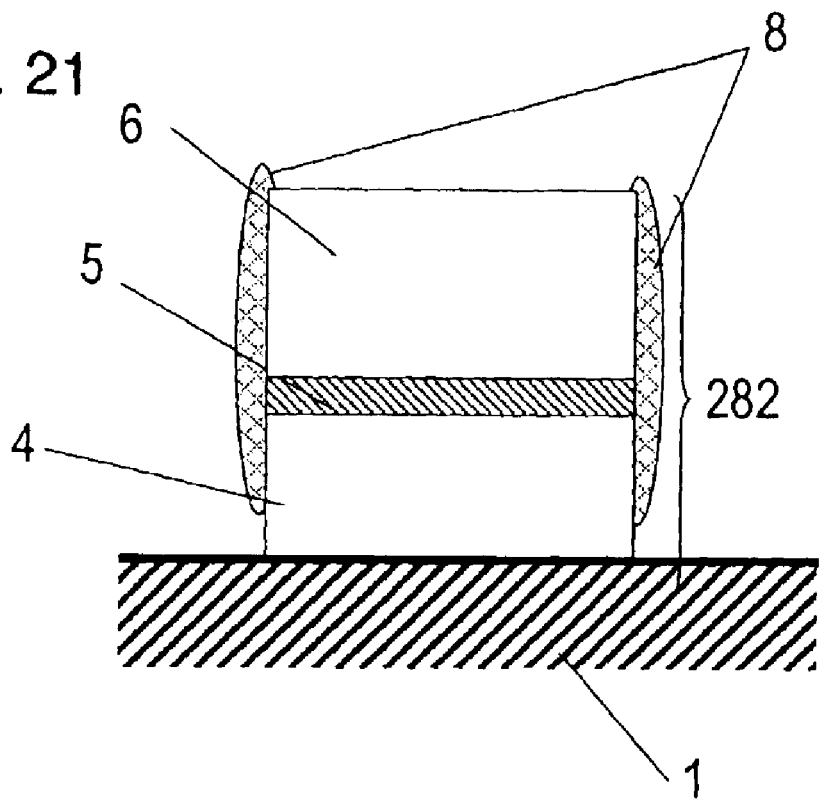
FIG. 21 is a section of a comb electrode, an essential part of each SAW filter of examples 13 and 14, and comparative examples 7 to 10 in accordance with exemplary embodiment 4 of the invention.
Figure 22:
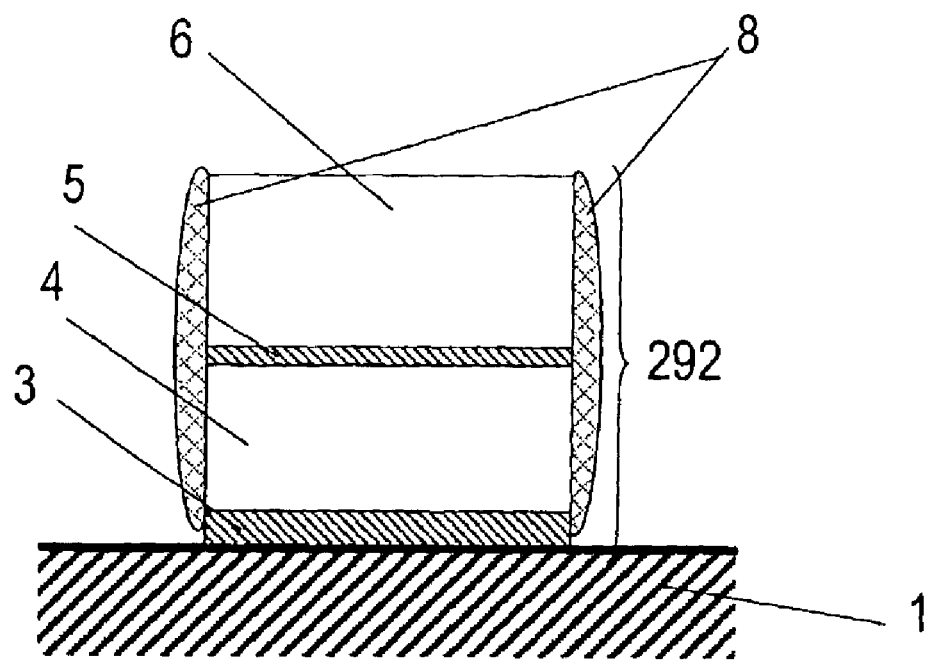
FIG. 22 is a section of a comb electrode, an essential part of each SAW filter of examples 15 and 16 in accordance with embodiment 4.
Figure 23:
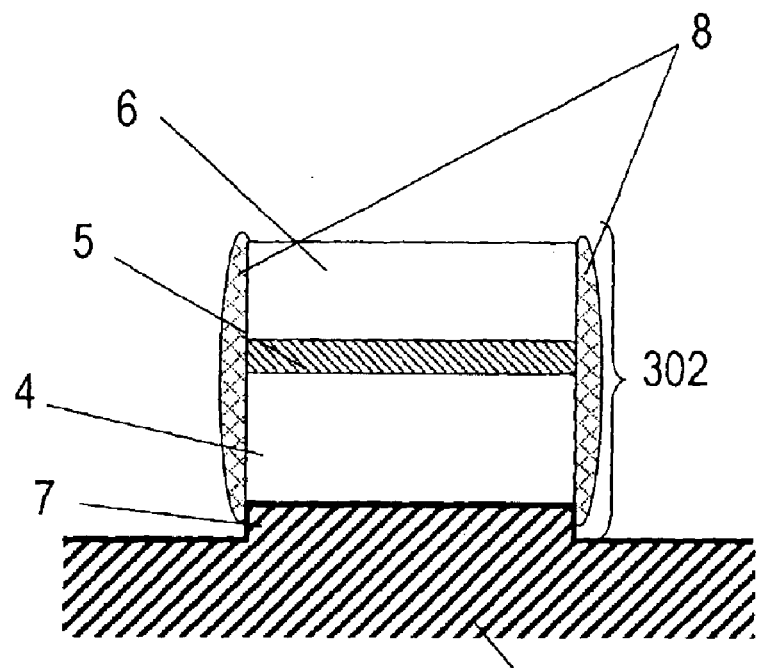
FIG. 23 is a section of a comb electrode, an essential part of each SAW filter of examples 17 and 18 in accordance with embodiment 4.

FIGS. 21 to 23 are sections of electrodes which are essential parts of respective SAW filters of examples 13 to 8 in accordance with exemplary embodiment 4 of the present invention. Electrodes of respective SAW filters of comparative examples 7 to 10 have sections each identical to the electrode illustrated in FIG. 21.

Each electrode 282 of examples 13 and 14, as shown in FIG. 21, includes first metal layer 4 having a thickness of 200 nm which consists of Al or consists mainly of Al, second layer 5, and third layer 6 that are stacked in this order over substrate 1. Second layer 5 prevents the first layer from grain boundary diffusion of Al atoms occurring in vertical to the substrate, while third layer 6 adjusts a thickness of electrode 282. Diffusion-preventing layer 8 is formed on each side of electrode 282 to prevent first layer 4 from the grain boundary diffusion of the Al atoms and does not reach the substrate, as shown in FIG. 21.

Each electrode 292 of examples 15 and 16, as shown in FIG. 22, includes base layer 3, first metal layer 4 having 200 nm, second layer 5, and third layer 6 that are stacked in this order over substrate 1. Second layer 5 prevents first metal layer 4 from grain boundary diffusion of Al atoms occurring in vertical to the substrate, while third layer 6 adjusts a thickness of electrode 292. Diffusion-preventing layer 8 is formed on each side of electrode 292 to prevent first metal layer 4 from the grain boundary diffusion of the Al atoms. The diffusion-preventing layer 8 does not reach the substrate, but covers the sides of first metal layer 4, second layer 5, third layer 6, and a part of each side of base layer 3, as shown in FIG. 22.

Each electrode 302 of examples 17 and 18, as shown in FIG. 23, includes first metal layer 4 having a thickness of 200 nm formed on a top of bump 7 of substrate 1, second layer 5 for preventing first metal layer 4 from grain boundary diffusion of Al atoms occurring in vertical to the substrate, and third layer 6 for adjusting a thickness of electrode 302. Diffusion-preventing layer 8 is formed on each side of electrode 302 to prevent first metal layer 4 from the grain boundary diffusion of the Al atoms. As shown in FIG. 23, diffusion-preventing layer 8 does not reach a bottom of the substrate, but covers each side of first metal layer 4, second layer 5, third layer 6, and a part of each side of bump 7 of substrate 1.

Electrodes of comparative examples 7 to 10 have structures identical to those of examples 13 and 14 illustrated by FIG. 21.

Table 7 shows materials of the layers, thicknesses of the layers, and methods of forming the layers of the electrodes of examples 13 to 18 and comparative examples 7 to 10.

TABLE 7

| | Number of Layers | Bump of Substrate (nm) | | Base Layer | First Layer | Second Layer | Third Layer | Method of Forming Layers | Section of Electrode |
|---|---|---|---|---|---|---|---|---|---|
| Example 13 | 3 | — | Material | — | *AlMg | Ti | AlMg | IBS | FIG. 21 |
| | | | Thickness | — | 200 | 20 | 240 | | |
| Example 14 | 3 | — | Material | — | *AlMg | Cu | AlMg | IBS | |
| | | | Thickness | — | 200 | 20 | 210 | | |
| Example 15 | 4 | — | Material | Ti | *AlMg | Ti | AlMg | DCMS | FIG. 22 |
| | | | Thickness | 10 | 200 | 20 | 230 | | |
| Example 16 | 4 | — | Material | Ti | *AlMg | Cu | AlMg | DCMS | |
| | | | Thickness | 10 | 200 | 20 | 200 | | |
| Example 17 | 3 | 10 | Material | — | *AlMg | Ti | AlMg | DCMS | FIG. 23 |
| | | | Thickness | — | 200 | 20 | 180 | | |
| Example 18 | 3 | 10 | Material | — | *AlMg | Cu | AlMg | DCMS | |
| | | | Thickness | — | 200 | 10 | 150 | | |
| Comparative Example 7 | 3 | — | Material | — | AlMg | Ti | AlMg | DCMS | FIG. 21 |
| | | | Thickness | — | 200 | 20 | 250 | | |
| Comparative Example 8 | 3 | — | Material | — | AlMg | Cu | AlMg | DCMS | |
| | | | Thickness | — | 200 | 20 | 220 | | |
| Comparative Example 9 | 3 | — | Material | — | *AlMg | Ti | AlMg | IBS | |
| | | | Thickness | — | 300 | 20 | 160 | | |
| Comparative Example 10 | 3 | — | Material | — | *AlMg | Cu | AlMg | IBS | |
| | | | Thickness | — | 300 | 20 | 260 | | |

IBS: Ion beam sputtering
DCMS: DC magnetron sputtering
Asterisk "*" in the "material" column denotes a (111)-oriented layer.
All the thicknesses are in nm.

As shown in Table 7, an AlMg alloy is used as metal of layer 4 consisting of Al or consisting mainly of Al in the fourth embodiment, and Ti is used for the base layer. Ti is used for the second layers of examples 13, 15, and 17, and comparative examples 7 and 9, while Cu is used for the second layers of examples 14, 16, and 18 and comparative examples 8 and 10. The layers are formed by either ion beam sputtering or DC magnetron sputtering. Having the electrode layers formed, the electrodes were examined by a θ–2θ X-ray diffraction method to determine orientation of the electrodes. Regarding the orientation of the AlMg layers of examples 13 to 18 and comparative examples 9 and 10, only a (111) peak of Al was observed, and thus the Al alloy layers are verified to be layers having a (111)-orientation in vertical to the substrate. Since each electrode includes two AlMg layers, that is, the first layer and the third layer, another sample having two layers, that is, a base layer and a first layer was prepared under the same conditions of the layer formation for the determination of the orientation. For comparative examples 7 and 8, no peak was observed from a specified crystal plane, and thus the layers of the samples are not verified to be oriented layers, but non-oriented polycrystalline layers. The filters of embodiment 4 have structure and design to those of embodiment 3. The electrodes are patterned by Ar+ ion milling. In the ion milling, since the patterning is physically carried out through sputtering, some sputtered atoms adhere to a side of the electrode, thus enabling the diffusion-preventing layer to be formed simultaneously to the patterning. However, the diffusion-preventing layer does not cover the entire side of the electrode, thus not reaching a bottom of the substrate.

Table 8 shows an estimated live time of a SAW filter having each electrode shown in Table 7. Table 8 also shows crystal grain sizes of the respective AlMg layers, the first layers of the electrodes.

TABLE 8

|  | Crystal Grain Size (nm) | Estimated Life Time (hrs) |  | Crystal Grain Size (nm) | Estimated Life time (hrs) |
| --- | --- | --- | --- | --- | --- |
| Example 13 | 200 | 58,000 | Comparative Example 7 | 200 | 14 |
| Example 14 | 200 | 63,000 | Comparative Example 8 | 200 | 170 |
| Example 15 | 200 | 85,000 | Comparative Example 9 | 300 | 120 |
| Example 16 | 200 | 100,000 | Comparative Example 10 | 300 | 1200 |
| Example 17 | 200 | 85,000 |  |  |  |
| Example 18 | 200 | 100,000 |  |  |  |

The crystal grain size represents the crystal grain size of the first layer.

As shown in Table 8, the SAW filter each including the electrodes of examples 13 to 18 have the estimated life time exceeding 50,000 hours (the criteria), while the filter of comparative examples 7 to 10 has the estimated life time less than 50,000 hours. The AlMg layer, the first layer of each electrode has the crystal grain size substantially the same as a thickness of the layer. After the test, in examples 13 and 14 and comparative examples, a side hillock was at a side of the comb electrode besides a degraded portion of the electrode. The side hillock is formed between the substrate and the diffusion-preventing layer on each side of the electrode to prevent the first metal layer from the grain boundary diffusion of the Al atoms. Examples 15 to 18 had no degradation of the electrode except for a degraded portion of the electrode. This shows that the grain boundary diffusion of the Al atoms through each side of the electrode is restrained with the diffusion preventing layer covering the part of the base layer or the part of each side of the bump of the substrate and covering the entire first metal layer.

The filters each including the second layer of Ti has larger resistance against an electric power than the filters each including the second layer of Cu. Since Cu has a diffusion coefficient to Al larger than a self-diffusion coefficient of Al, Cu atoms diffuse along grain boundaries in the second layer at a heating process in a manufacturing process for the filter, thereby obstructing a path of the grain boundary diffusion of Al atoms. For this reason, the grain boundary diffusion of the Al atoms in horizontal direction to the substrate is restrained. Cu easily diffuses easily into Al, and further, easily forms metallic compound with Al, and has the grain size grow in the second layer. Therefore, a change in temperature during the process and a thickness of the Cu layer influence an effect of restraining the Al atoms. A resistance of the electrode layer easily increases. Thus the filters have characteristics and resistance against an electric power and characteristics ranging widely.

The second layer containing the metal having the larger diffusion coefficient to Al than the self-diffusion coefficient of Al having large resistance against an electric power. The layer has an optimum thickness, thus requiring the manufacturing process, particularly the heating process to be controlled. If the thickness of the first metal layer consisting of Al or consisting mainly of Al is 200 nm or less, the thickness of the second layer of Cu is preferably 20 nm or less, more preferably 10 nm or less. Moreover, the heating process is carried out preferably at 250° C. or less, more preferably at 200° C. or less.

The second layer containing metal having a diffusion coefficient to Al smaller than the self-diffusion coefficient of Al is expected to be less effective for restraining the grain boundary diffusion of the Al atoms in the first metal layer consisting of Al or consisting mainly of Al that occurs in horizontal to the substrate, but enables the filter to have stabile resistance against an electric power and stable characteristics.

These facts show that the diffusion-preventing layer covering each entire side of the first layer effectively restrains the grain boundary diffusion of the Al atoms of the first metal layer consisting of Al or consisting mainly of Al that occurs in horizontal to the substrate. The diffusion-preventing layer may be formed by the patterning carried out through sputtering etching. The base layer or the bump formed by grinding the substrate is effective. The diffusion-preventing layer formed on each side of the electrode by the method naturally become a laminated layer or an alloy layer with the first metal layer consisting of Al or consisting mainly of Al and either the base layer or the material of the substrate, thus having large resistance against migration (Exemplary Embodiment 5)

Figure 24:
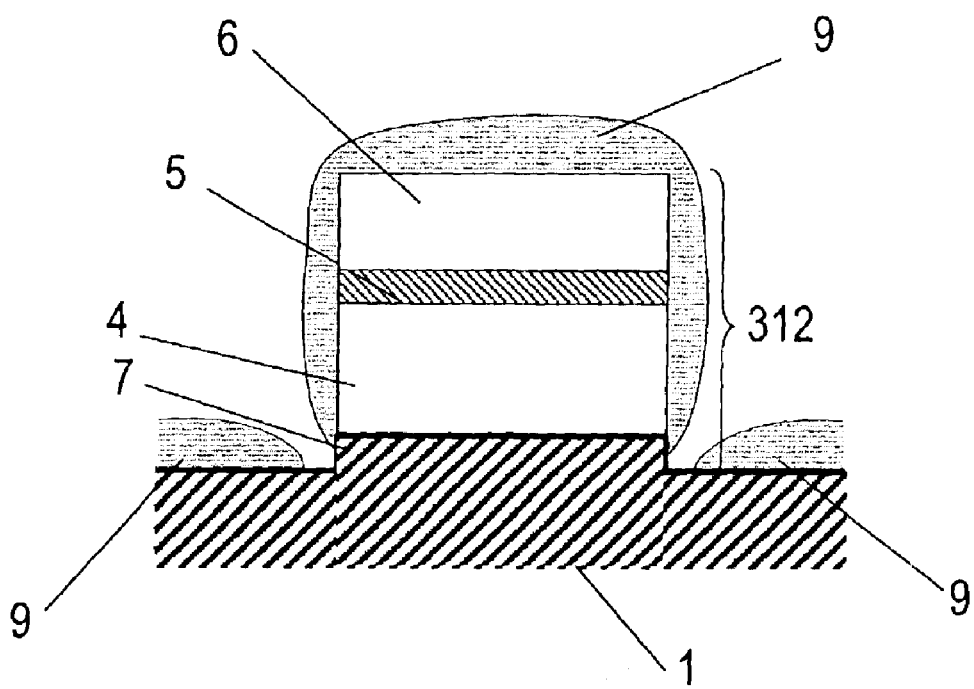
FIG. 24 is a section of a comb electrode, an essential part of each SAW filter of examples 19 and 20 in accordance with exemplary embodiment 5 of the invention.
Figure 25:
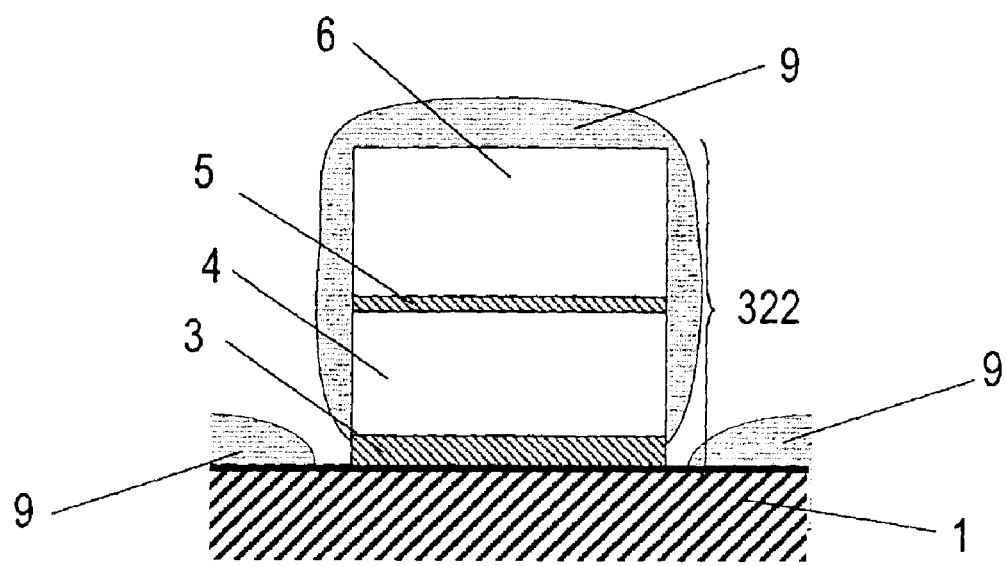
FIG. 25 is a section of a comb electrode, an essential part of each SAW filter of examples 21 and 22 in accordance with embodiment 5.
Figure 26:
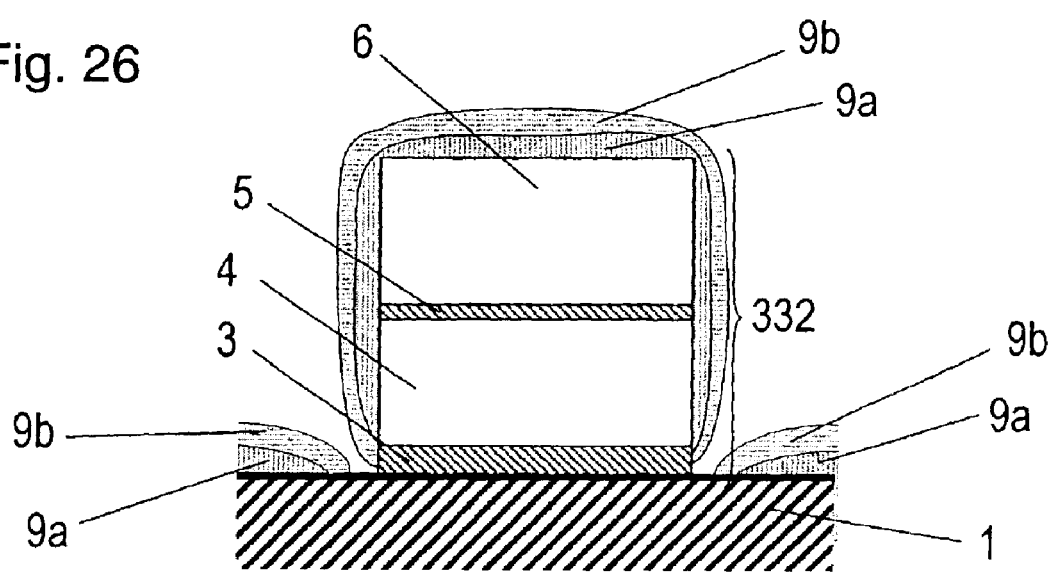
FIG. 26 is a section of a comb electrode, an essential part of a SAW filter of example 23 in accordance with embodiment 5.
Figure 27:
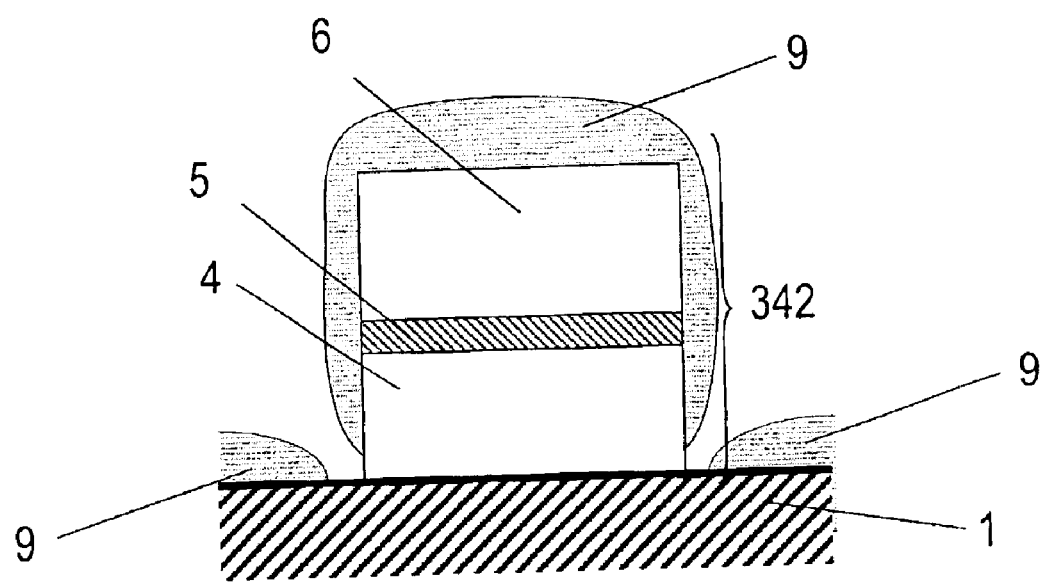
FIG. 27 is a section of a comb electrode, an essential part of a SAW filter of comparative example 11 in accordance with embodiment 5.

FIGS. 24 to 26 are sections of electrodes which are essential parts of respective SAW filters of examples 19 to 23 in accordance with exemplary embodiment 5. FIG. 27 is a section of an electrode of a SAW filter of comparative Example 11.

Each electrode 312 of examples 19 and 20, as shown in FIG. 24, includes first metal layer 4 of a 200 nm thickness on a top of bump 7 of substrate 1, second layer 5 for preventing the first metal layer from grain boundary diffusion of Al atoms occurring in vertical to the substrate, and third layer 6 for adjusting a thickness of electrode 312. After the electrode is patterned, protective layer 9 is formed over electrode 312. Protective layer 9 of example 19 is made of silicon nitride and has a thickness of 100 nm, while protective layer 9 of example 20 is made of silicon oxide and has a thickness of 100 nm. According to an observation with an electron microscope, the protective layer was not formed about the bump of the substrate, specifically about a boundary between the comb electrode and a bottom of the substrate between the electrodes, thus being discontinuously formed, as shown in FIG. 24.

Each electrode 322 of examples 21 and 22, as shown in FIG. 25, includes base layer 3, first metal layer 4 having a 200 nm-thickness, second layer 5, and third layer 6 that are stacked in this order over substrate 1. Second layer 5 prevents the first layer from grain boundary diffusion of Al atoms occurring in vertical to the substrate, while third layer 6 adjusts a thickness of electrode 322. After electrode 322 is formed, protective layer 9 is formed over electrode 322. Protective layer 9 of example 21 is made of silicon nitride and has a thickness of 100 nm, while protective layer 9 of example 22 is made of silicon oxide and has a thickness of 100 nm. According to an observation with an electron microscope, protective layer 9 was not formed about a boundary between base layer 3 and a bottom of substrate 1, as shown in FIG. 25.

Electrode 332 of example 23, as shown in FIG. 26, includes base layer 3, first metal layer 4 of a 200 nm-thickness, second layer 5, and third layer 6 that are stacked in this order over substrate 1. Second layer 5 prevents the first metal layer from grain boundary diffusion of Al atoms occurring in vertical to the substrate, while third layer 6 adjusts a thickness of electrode 332. After electrode 332 is formed, silicon nitride layer 9a of a 50 nm-thickness and silicon oxide layer 9b of 50 nm-thickness are formed over electrode 332. According to an observation with an electron microscope, protective layers 9a and 9b are not formed about a boundary between base layer 3 and a bottom of substrate 1, as shown in FIG. 26.

Electrode 342 of comparative example 11, as shown in FIG. 27, includes first metal layer 4 of a 200 nm-thickness, second layer 5 for preventing the first metal layer from grain boundary diffusion of Al atoms occurring in vertical to the substrate, and third layer 6 for adjusting a thickness of electrode 342. After the electrode is formed, protective layer 9 of a 100 nm-thickness made of silicon nitride is formed over electrode 342. According to an observation with an electron microscope, protective layer 9 was not formed about a boundary between electrode 342 and a bottom of substrate 1, as shown in FIG. 27.

Table 9 shows materials of the layers, thicknesses of the layers, and methods of forming the layers of the electrodes of examples 19 to 23 and comparative example 11.

conditions of the layer formation for determination of their orientation. The filters of the present embodiment have structures identical to those of the first embodiment. The filter is provided with the Al electrode having a thickness of 480 nm to have a center frequency of about 800 MHz. The electrodes are formed by photolithography and dry etching. After the electrodes are formed, a protective layer is formed. And a portion of the protective layer for electrical connection is then removed by etching, and a resulting resonator is mounted on an alumina substrate to face down toward the substrate. In the present embodiment, the filters are not hermetically sealed. The filters of this embodiment are evaluated in the same manner as in the first embodiment in respective resistances against electric power. The filters, which include the protective layers, are evaluated while having their respective surfaces exposed to atmospheric air. Table 10 shows an estimated life time of each SAW filter having the electrodes shown in Table 9. Table 10 also shows crystal grain sizes of the AlMg layers (the first layers) of the electrodes.

TABLE 9

| | Number of Layers | Bump of Substrate (nm) | | Base Layer | First Layer | Second Layer | Third Layer | Protective Layer | Method of Forming Layers | Section of Electrode |
|---|---|---|---|---|---|---|---|---|---|---|
| Example 19 | 3 | 10 | Material | — | *AlMg | Ti | AlMg | Silicon Nitride | IBS | FIG. 27 |
| | | | Thickness | — | 200 | 20 | 140 | 100 | | |
| Example 20 | 3 | 10 | Material | — | *AlMg | Ti | AlMg | Silicon Oxide | IBS | |
| | | | Thickness | — | 200 | 20 | 140 | 100 | | |
| Example 21 | 4 | — | Material | Ti | *AlMg | Ti | AlMg | Silicon Nitride | DCMS | FIG. 28 |
| | | | Thickness | 10 | 200 | 20 | 190 | 100 | | |
| Example 22 | 4 | — | Material | Ti | *AlMg | Ti | AlMg | Silicon Oxide | DCMS | |
| | | | Thickness | 10 | 200 | 20 | 190 | 100 | | |
| Example 23 | 4 | — | Material | Ti | *AlMg | Ti | AlMg | Silicon Oxide/ Silicon Nitride | DCMS | FIG. 29 |
| | | | Thickness | 10 | 200 | 20 | 190 | 50/50 | | |
| Comparative Example 11 | 3 | — | Material | — | *AlMg | Ti | AlMg | Silicon Nitride | IBS | FIG. 30 |
| | | | Thickness | — | 200 | 20 | 210 | 100 | | |

IBS: Ion beam sputtering
DCMS: DC magnetron sputtering
The asterisk "*" in the "material" column denotes a (111)-oriented layer.
All the thicknesses are in nm.

As shown in Table 9, an AlMg alloy is used as the metal consisting of Al or consisting mainly of Al in embodiment 5, and Ti is used for base layers 3 and second layers 5. The layers are formed by either ion beam sputtering or DC magnetron sputtering. Having the electrode layers formed the electrodes were examined by a θ–2θ X-ray diffraction method to determine orientation. Regarding the orientation of the AlMg layers of examples 19 to 23 and comparative example 11, only a (111) peak of Al was observed. Thus, it is verified that the Al alloy layer is a (111)-orientation in vertical to the substrate. Since each sample includes two AlMg layers, that are the first layer and the third layer, another sample having a first layer and a still another sample having a base layer and a first layer are made under the same

TABLE 10

| | Crystal Grain Size (nm) | Estimated Life Time (hrs) | | Crystal Grain Size (nm) | Estimated Life Time (hrs) |
|---|---|---|---|---|---|
| Example 19 | 200 | 60,000 | Comparative Example 11 | 200 | 320 |
| Example 20 | 200 | 65,000 | | | |
| Example 21 | 200 | 60,000 | | | |

TABLE 10-continued

| | Crystal Grain Size (nm) | Estimated Life Time (hrs) | Crystal Grain Size (nm) | Estimated Life Time (hrs) |
|---|---|---|---|---|
| Example 22 | 200 | 65,000 | | |
| Example 23 | 200 | 65,000 | | |

The crystal grain size represents the crystal grain size of the first layer.

As shown in Table 10, the SAW filters including the respective electrodes of examples 19 to 23 have the estimated life time exceeding 50,000 hours (a criteria), while the filter of comparative example 11 has the estimated life of less than 50,000 hours. The AlMg layer (the first layer) of each electrode has the crystal grain size substantially the same as a thickness of the electrode. It is apparent that the filters of examples 19 and 21 each provided with the protective layer of silicon oxide have improved resistance against electric power as compared with the filters of examples 20 and 22 each provided with the protective layer of silicon nitride. It was observed that the filters have electric characteristics slightly degraded after they have the protective layer of silicon nitride formed, while the filters have no changes in electric characteristics even after they have the protective layer of silicon oxide formed. The filter of example 23 including the laminated protective layer of silicon nitride and silicon oxide exhibited no change in electric characteristics even after the filter had the protective layers formed. It was observed that the filter had an improved resistance against electric power that was similar to that of the filter including only the silicon nitride. Although the filter of comparative example 11 has an electrode structure identical to that of example 13 of embodiment 4 and to have an excellent resistance against electric power, the filter has a short estimated life of 320 hours. Conceivably, this is because the filters are not hermetically sealed in embodiment 5. The filters of examples 19 to 23 exhibit substantially the same level of resistance against electric power as the filters hermetically sealed. It is conceivable from this fact that the filter of comparative example 11 has the short life time since its first metal layer consisting of Al or consisting mainly of Al is partially exposed, not being entirely covered by the protective layer. The protective layer easily has a discontinuous portion as shown in each of FIGS. 25 to 27 about a boundary between the electrode and a bottom of the substrate where the protective: layer on the electrodes is thin. If such a discontinuous portion is formed, it is apparent that the bump to the substrate or the base metal layer having excellent moisture resistance in the present embodiment is effective for extending the life time of the filter.

The protective layer prevents the electrode from a hillock caused by migration of the Al atoms, thus improving the resistance against electric power, preventing the electrodes from a short circuit between them, and improving moisture resistance.

In embodiment 5, the electrode is constructed to have the resistance against electric power and the moisture resistance due to the protective layer. The protective layer on the electrode provided with the bump at the substrate or the base layer having the excellent moisture resistance is effective for extending the life time of the filter.

In embodiments 1 to 5, the structures of the electrodes for specified filters are described. However, the present invention is not limited to the structures, the thicknesses, the materials and others of the layers described in the embodiments. In particular, the thickness of the layer consisting of Al or consisting mainly of Al is preferably 0.01·L or less, where L is a width of the electrode of the SAW filter. Thus, conductive powder can be sufficiently fine, whereby stress on the electrode that is caused by propagation of surface acoustic waves can be sufficiently dispersed.

INDUSTRIAL APPLICABILITY

The present invention provides a surface acoustic wave filter having improved resistance against stress caused by propagation of surface acoustic waves, and a method of manufacturing the filter.

What is claimed is:

1. A surface acoustic wave (SAW) filter comprising:
a substrate; and
an electrode provided over said substrate, said electrode comprising:
a first layer having a thickness of 200 nm or less, said first layer being an oriented layer having a given orientation with respect with said substrate, said first layer being made of metal including Al,
a second layer on said first layer, said second layer preventing said first layer from grain boundary diffusion, said second layer being made of metal, said first layer being located between said substrate and said second layer, and
a third layer on said second layer, said third layer adjusting a thickness of said electrode.

2. The SAW filter of claim 1, wherein said metal including Al is one of Al and an alloy of Al and at least one of Mg, Zr, Cu, Sc, Ti, and Ta.

3. The SAW filter of claim 1, wherein said grain-boundary-diffusion preventing layer is made of material including metal having a diffusion coefficient into Al smaller than a self-diffusion coefficient of Al.

4. The SAW filter of claim 3, wherein said metal having said diffusion coefficient into Al smaller than said self-diffusion coefficient of Al is one of TI, Ta, W, and Cr.

5. The SAW filter of claim 1, further comprising:
a protective layer covering at least a portion of said electrode.

6. The SAW filter of claim 5, wherein said protective layer contains silicon nitride.

7. The SAW filter of claim 5, wherein said protective layer comprises a laminated layer including a layer of silicon nitride and a layer of silicon oxide.

8. The SAW filter of claim 5, wherein said protective layer contains silicon oxide.

9. A surface acoustic wave SAW filter comprising:
a substrate;
an electrode provided over said substrate, said electrode comprising a first layer having a thickness of 200 nm or less, said first layer being an oriented layer having a given orientation with respect with said substrate, said first layer being made of metal including Al; and
a grain-boundary-diffusion-preventing layer provided on said electrode and made of metal, said electrode being located between said substrate and said grain-boundary-diffusion-preventing layer;
wherein said grain-boundary-diffusion-preventing layer is made of material including metal having a diffusion coefficient into Al larger than a self-diffusion coefficient of Al.

10. The SAW filter of claim 9, wherein said metal having said diffusion coefficient into Al larger than said self-diffusion coefficient of Al is one of Cu, Pd, and Mg.

11. A surface acoustic wave (SAW) filter comprising:
a substrate;
an electrode provided over said substrate, said electrode comprising a first layer having a thickness of 200 nm or less, said first layer being an oriented layer having a given orientation with respect with said substrate, said first layer being made of metal including Al;
a grain-boundary-diffusion-preventing layer provided on said electrode and made of metal, said electrode being located between said substrate and said grain-boundary-diffusion-preventing layer; and
an Al-atom-diffusion-preventing layer provided on a side of said electrode.

12. The SAW filter of claim 11, wherein said Al-atom-diffusion-preventing layer covers a side of said first layer.

13. A method of manufacturing a surface acoustic wave filter, comprising the steps of:
forming an electrode over a substrate, the electrode including a layer of metal including Al; and
forming at least a portion of an Al-diffusion-preventing layer on a side of the electrode by sputter etching simultaneously to the forming of the electrode.

14. A surface acoustic wave (SAW) filter comprising:
a substrate; and
an electrode provided over said substrate, said electrode comprising a first layer having a thickness of 200 nm or less, said first layer being an oriented layer having a given orientation with respect with said substrate, wherein said substrate comprises a bump, and said electrode is provided on a top of said bump.

15. A surface acoustic wave SAW filter comprising:
a substrate;
an electrode provided over said substrate, said electrode comprising a first layer having a thickness of 200 nm or less, said first layer being an oriented layer having a given orientation with respect with said substrate, said first layer being made of metal including Al; and
a grain-boundary-diffusion-preventing layer provided on said electrode and made of metal, said electrode being located between said substrate and said grain-boundary-diffusion-preventing layer;
wherein said substrate comprises a bump, and said electrode is provided on a top of said bump.

16. The SAW filter of claim 15, further comprising:
an Al-atom-diffusion-preventing layer provided on a side of said electrode.

17. The SAW filter of claim 16, wherein said Al-atom-diffusion-preventing layer covers a side of said first layer.

18. The SAW filter of claim 17, wherein said Al-atom-diffusion-preventing layer covers at least a portion of a side of said bump.

19. The SAW filter of claim 15, further comprising:
a protective layer covering at least a portion of said electrode.

20. The SAW filter of claim 19, wherein said protective layer contains silicon oxide.

21. The SAW filter of claim 19, wherein said protective layer covers at least a portion of a side of said bump.

22. The SAW filter of claim 19, wherein said protective layer contains silicon nitride.

23. The SAW filter of claim 19, wherein said protective layer comprises a laminated layer including a layer of silicon nitride and a layer of silicon oxide.

24. A surface acoustic wave SAW filter comprising:
a substrate;
an electrode provided over said substrate, said electrode comprising
a first layer having a thickness of 200 nm or less, said first layer being an oriented layer having a given orientation with respect with said substrate, said first layer being made of metal including Al; and
a grain-boundary-diffusion-Preventing layer provided on said electrode and made of metal, said electrode being located between said substrate and said grain-boundary-diffusion-preventing layer, and
a base layer provided between said substrate and said first layer; and
an Al-atom-diffusion-preventing layer provided on a side of said electrode.

25. The SAW filter of claim 24, wherein said Al-atom-diffusion-preventing layer covers a side of said first layer.

26. The SAW filter of claim 25, wherein said Al-atom-diffusion-preventing layer covers at least a portion of a side of said base layer.

27. The SAW filter of claim 24, further comprising:
a protective layer covering at least a portion of said electrode.

28. The SAW filter of claim 27, wherein said protective layer contains silicon oxide.

29. The SAW filter of claim 27, wherein said protective layer covers at least a portion of a side of said base layer.

30. The SAW filter of claim 27, wherein said protective layer contains silicon nitride.

31. The SAW filter of claim 27, wherein said protective layer comprises a laminated layer including a layer of silicon nitride and a layer of silicon oxide.

32. A surface acoustic wave (SAW) filter comprising:
a substrate;
an electrode provided over said substrate, said electrode comprising a first layer having a thickness of 200 nm or less, said first layer being an oriented layer having a given orientation with respect with said substrate, said first layer being made of metal including Al; and
an Al-atom-diffusion-preventing layer provided on a side of said electrode, said Al-atom-diffusion-preventing layer being made of metal.

33. The SAW filter of claim 32, wherein said metal including Al is one of Al and an alloy of Al and at least one of Mg, Zr, Cu, Sc, Ti, and Ta.

34. The SAW filter of claim 32, wherein said electrode further comprises a second layer on said first layer, said second layer preventing said first layer from grain boundary diffusion.

35. The SAW filter of claim 34, wherein said electrode further comprises a third layer on said second layer, said third layer adjusting a thickness of said electrode.

36. The SAW filter of claim 32, further comprising:
a grain-boundary-diffusion-preventing layer provided on said electrode.

37. The SAW filter of claim 36, wherein said grain-boundary-diffusion preventing layer is made of material including metal having a diffusion coefficient into Al smaller than a self-diffusion coefficient of Al.

38. The SAW filter of claim 37, wherein said metal having said diffusion coefficient into Al smaller than said self-diffusion coefficient of Al is one of Ti, Ta, W, and Cr.

39. The SAW filter of claim 36, wherein said grain-boundary-diffusion-preventing layer is made of material including metal having a diffusion coefficient into Al larger than a self-diffusion coefficient of Al.

40. The SAW filter of claim 39, wherein said metal having said diffusion coefficient into Al larger than said self-diffusion coefficient of Al is one of Cu, Pd, and Mg.

41. The SAW filter of claim 32, wherein said Al-atom-diffusion-preventing layer covers a side of said first layer.

42. The SAW filter of claim 32, further comprising:
a protective layer covering at least a portion of said electrode.

43. The SAW filter of claim 42, wherein said protective layer contains silicon nitride.

44. The SAW filter of claim 42, wherein said protective layer comprises a laminated layer including a layer of silicon nitride and a layer of silicon oxide.

45. The SAW filter of claim 42, wherein said protective layer contains silicon oxide.

46. The SAW filter of claim 32, wherein said substrate comprises a bump, and said electrode is provided on a top of said bump.

47. The SAW filter of claim 46, wherein said Al-atom-diffusion-preventing layer covers a side of said first layer.

48. The SAW filter of claim 47, wherein said Al-atom-diffusion-preventing layer covers at least a portion of a side of said bump.

49. The SAW filter of claim 46, further comprising:
a protective layer covering at least a portion of said electrode.

50. The SAW filter of claim 49, wherein said protective layer covers at least a portion of a side of said bump.

51. The SAW filter of claim 49, wherein said protective layer contains silicon nitride.

52. The SAW filter of claim 49, wherein said protective layer comprises a laminated layer including a layer of silicon nitride and a layer of silicon oxide.

53. The SAW filter of claim 49, wherein said protective layer contains silicon oxide.

54. The SAW filter of claim 32, wherein said electrode further comprises a base layer provided between said substrate and said first layer.

55. The SAW filter of claim 54, wherein said Al-atom-diffusion-preventing layer covers a side of said first layer.

56. The SAW filter of claim 55, wherein said Al-atom-diffusion-preventing layer covers at least a portion of a side of said base layer.

57. The SAW filter of claim 54, further comprising:
a protective layer covering at least a portion of said electrode.

58. The SAW filter of claim 57, wherein said protective layer covers at least a portion of a side of said base layer.

59. The SAW filter of claim 57, wherein said protective layer contains silicon nitride.

60. The SAW filter of claim 57, wherein said protective layer comprises a laminated layer including a layer of silicon nitride and a layer of silicon oxide.

61. The SAW filter of claim 57, wherein said protective layer contains silicon oxide.

* * * * *

UNITED STATES PATENT AND TRADEMARK OFFICE
CERTIFICATE OF CORRECTION

PATENT NO. : 6,909,341 B2
DATED : June 21, 2005
INVENTOR(S) : Takayama et al.

It is certified that error appears in the above-identified patent and that said Letters Patent is hereby corrected as shown below:

Title page,
Item [56], References Cited, U.S. PATENT DOCUMENTS, insert:
-- 6,486,591 B2    11/2002    Nishihara
   6,657,366 B2    12/2003    Watanabe et al.
   6,377,138 B1    04/2002    Takagi, et al.
   6,630,767 B2    10/2003    Inoue et al. --.

Column 20,
Line 9, "Preventing" should read -- preventing --.

Signed and Sealed this

Tenth Day of January, 2006

JON W. DUDAS
*Director of the United States Patent and Trademark Office*